United States Patent
Zohny et al.

(10) Patent No.: US 9,088,248 B2
(45) Date of Patent: Jul. 21, 2015

(54) AMPLIFIER AND MOBILE COMMUNICATION DEVICE

(75) Inventors: Amr Zohny, Erlangen (DE); Stephan Leuschner, Munich (DE); Jan-Erik Mueller, Ottobrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 79 days.

(21) Appl. No.: 13/472,939

(22) Filed: May 16, 2012

(65) Prior Publication Data

US 2013/0310114 A1    Nov. 21, 2013

(51) Int. Cl.
*H03F 1/22* (2006.01)
*H03F 3/193* (2006.01)

(52) U.S. Cl.
CPC ...................... *H03F 3/193* (2013.01)

(58) Field of Classification Search
USPC .............. 330/295, 124 R, 285, 311, 133
See application file for complete search history.

(56) References Cited

U.S. PATENT DOCUMENTS

| | | | |
|---|---|---|---|
| 4,409,557 A | 10/1983 | Sechi | |
| 4,496,909 A | 1/1985 | Knapp | |
| 5,387,880 A | 2/1995 | Kobayashi | |
| 6,137,367 A | 10/2000 | Ezzedine et al. | |
| 7,164,318 B2 | 1/2007 | Costa et al. | |
| 7,323,937 B2 * | 1/2008 | Ooya et al. | 330/295 |
| 7,368,993 B2 | 5/2008 | Beffa | |
| 8,022,772 B2 * | 9/2011 | Cassia et al. | 330/311 |
| 8,102,207 B2 | 1/2012 | Day | |
| 2006/0119435 A1 | 6/2006 | Oh et al. | |
| 2009/0184769 A1 | 7/2009 | Lee et al. | |
| 2011/0018625 A1 | 1/2011 | Hodel et al. | |
| 2012/0229216 A1 | 9/2012 | Benson | |

FOREIGN PATENT DOCUMENTS

DE    102009005120 A1    7/2010

OTHER PUBLICATIONS

Wu, e.a., "A 900-MHz 29.5-dBm 0.13-um CMOS HiVP Power Amplifier" IEEE Transactions on Microwave Theory and Techniques. Published in 2008. 6 Pages.

Ezzedine, e.a., "High-Voltage FET Amplifiers for Satellite and Phasedarray Applications" IEEE MTT-S Digest. Published in 1985. 4 Pages.

Pornpromlikit, e.a., "A Watt-Level Stacked-FET Linear Power Amplifier in Silicon-on-InsulatorCMOS" IEEE Transactions on Microwave Theory and Techniques, vol. 58, No. 1, Jan. 2010. 8 Pages.

(Continued)

*Primary Examiner* — Hieu Nguyen
(74) *Attorney, Agent, or Firm* — Eschweiler & Associates, LLC

(57) ABSTRACT

An amplifier includes a first lower active sub cell and a second lower active sub cell, each comprising an input terminal and an output terminal, wherein the input terminals of the lower active sub cells are connected to the amplifier input and the output terminals of the lower active sub cells are not shorted. Furthermore, the amplifier includes a first upper active sub cell and a second upper active sub cell, each including a biasing terminal, wherein the input terminals and the output terminals of the upper active sub cells are coupled between the output terminals of the lower active sub cells and the amplifier output. The amplifier includes a bias controller configured to provide a first biasing signal to the first upper active sub cell and a second biasing signal to the second upper active sub cell based on an output power of the output signal.

23 Claims, 24 Drawing Sheets

(56) References Cited

OTHER PUBLICATIONS

Ezzedine, e.a, "CMOS PA for Wireless Applications" 2007 IEEE Radio and Wireless Symposium, Jan. 2007. 3 Pages.

D. Bondar, N.D. Lopez, Z. Popovic and D. Budimir, "Linearization of High-Efficiency Power Amplifiers using Digital Baseband Predistortion with Iterative Injection", Radio and Wireless Symposium (RWS), Jan. 2010.

U.S. Appl. No. 13/628,904, filed Sep. 27, 2012. 35 Pages.

H. Park, D. Baek, K. Jeon and S. Hong, "A Predistortion Linearizer Using Envelope-Feedback Technique with Simplified Carrier Cancellation Scheme for Class-A and Class-AB Power Amplifiers", IEEE Transactions on Microwave Theory and Techniques, vol. 48, No. 6, Jun. 2000.

N. Delaunay, N. Deltimple, D. Belot, and E. Kerhervé, "Linearization of a 65nm CMOS Power Amplifier with a Cartesian Feedback for W-CDMA Standard", IEEE Newscastaisa '09, Jun. 2009.

H. Liao, J. Chen, H. Chiou and C. Chen, "High-Linearity CMOS Feedforward Power Amplifier for WiMAX application", APMC 2008 Asia-Pacific Microwave Conference, Dec. 2008.

L. Guan and A. Zhu, "Dual-loop Model Extraction for Digital Predistortion of Wideband RF Power Amplifiers", IEEE Microwave and Wireless Components Letters, vol. 21, No. 9, Sep. 2011.

G. Montoro, P. Gilabert, J. Berenguer and E. Bertran, "Digital Predistortion of Envelope Tracking Amplifiers driven by Slew-Rate Limited Enveloples", IEEE MTT-S International, Jun. 2011.

L. Jixiain and Y. Bin, "Digital Predistortion for Power Amplifiers with Memory Effects", Microwave Conference Proceedings CJMW2011, Apr. 2011.

S. Ko and J. Lin, "A CMOS RF Predistorter using Diode-Connected MOSFET", Microwave and Optical Technology Letters, vol. 49, No. 9, Sep. 2007.

Y. Liao, D. Su, Y. Wang and W. Chen, "A Design of Analog Predistortion Linearizer for RF Power Amplifier to Reduce IMD", 8th International Symposium on Antennas, Propagation and EM Theory (ISAPE 2008), Nov. 2008.

M. Zhao, L. Sun, J. Wen, Z. Yu and J. Kang, "A 2.45 GHz CMOS Power Amplifier with High Linearity", ASICON '09, Oct. 2009.

J. Wang and Z. Liu, "A 900 MHz High Efficiency and Linearity Adaptive CMOS Power Amplifier", International Conference on Electric Information and Control Engineering (ICEICE), Apr. 2011.

C. Lu, A. Pham, M. Shaw and C. Saint, "Linearization of CMOS Broadband Power Amplifiers through Combined Multi-gated Transistors and Capacitance Compensation", IEEE Transactions on Microwave Theory and Techniques, vol. 55, No. 11, 2007.

Q. Liu, S. Jiangtao, Y. Shu, K. Horie, N. Itoh and T. Yoshimasu, "A High Efficiency and High Linearity Power Amplifier utilizing Post-linearization Technique for 5.8 GHz DSRC Applications", Power Amplifiers for Wireless and Radio Applications (PAWR), Jan. 2011.

S. Leuschner, S. Pinarello, U. Hodel, J.E. Müller and H. Klar, "A 31-dBm, high ruggedness power amplifier in 65-nm standard CMOS with high-efficiency stacked-cascode stages", Radio Frequency Integrated Circuits Symposium (RFIC), May 2010.

S. Leuschner, J.E. Müller and H. Klar, "A 1.8 GHz wide-band stacked-cascode CMOS power amplifier for WCDMA applications in 65nm standard CMOS", Radio Frequency Integrated Circuits Symposium (RFIC), Jun. 2011.

Office Action Dated Feb. 20, 2014 U.S. Appl. No. 13/628,904.

Notice of Allowance Dated May 16, 2014 U.S. Appl. No. 13/628,904.

* cited by examiner

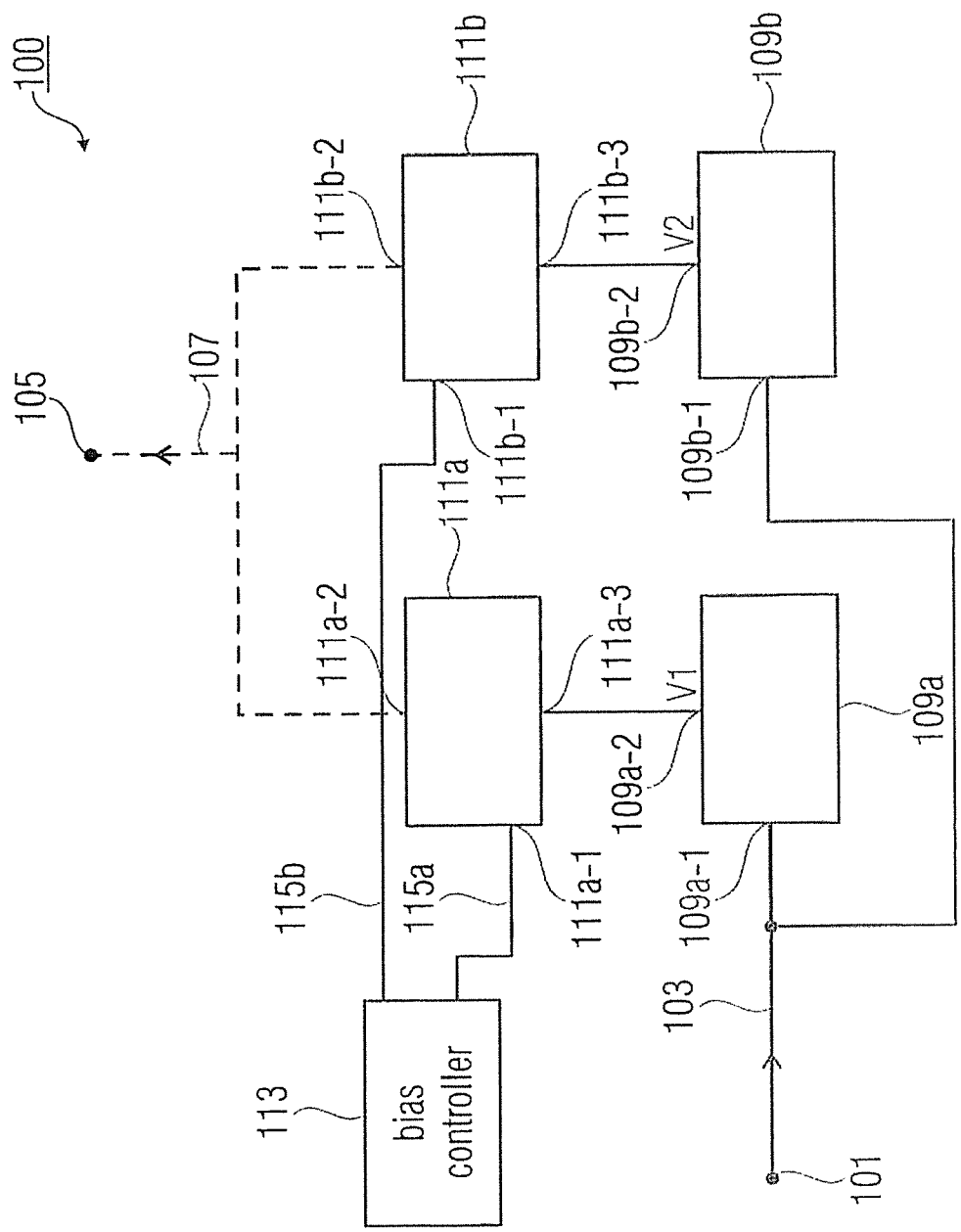

AMPLIFIER AND MOBILE COMMUNICATION DEVICE

FIELD

Embodiments of the present invention relate to an amplifier. Further embodiments of the present invention relate to a mobile communication device comprising such an amplifier.

BACKGROUND

Wireless infrastructure has been rapidly taking over as the cornerstone of modern communication means in the past two decades. One can now recognize the importance of GPS systems, WLAN and most importantly cellular systems (GSM/UMTS/LTE). Modern 3G and 4G systems require broad bandwidth channels of up to 20 MHz and allow high data rates of up to 100 Mb/s range utilizing non-constant envelope modulation schemes. These schemes are characterized by their high spectral efficiency and crest factor. Due to the implied demands on linearity, the power amplifier (PA) associated with the system is often operated at several dB below its peak output power with stringent requirements on both performance and price.

Financially, RF-CMOS technology provides the best option for wide-scale cheap production compared to GaAs and GaN. However, performance-wise, RF-CMOS suffers from drawbacks. Among the drawbacks is its low voltage-robustness, leading to lower achievable saturated output power. Moreover, it suffers from low efficiency and low maximum linear output power compared to the other technologies. These limitations hinder the combination of the CMOS PA with other software-defined radio blocks on a single chip to achieve true integration.

SUMMARY

Embodiments of the present invention relate to an amplifier comprising an amplifier input for receiving an input signal and an amplifier output for providing an output signal. Furthermore, the amplifier comprises a first lower active sub cell and a second lower active sub cell. Each lower active sub cell comprises an input terminal and an output terminal. The input terminals of the lower active sub cells are connected to the amplifier input and the output terminals of the lower active sub cells are not shorted. Furthermore, the amplifier comprises a first upper active sub cell and a second upper active sub cell. Each of the upper active sub cells comprises a biasing terminal, an input terminal and an output terminal. The input terminals and the output terminals of the upper active sub cells are coupled between the output terminals of the lower active sub cells and the amplifier output. Furthermore, the amplifier comprises a bias controller configured to provide a first biasing signal to the biasing terminal of the first upper active sub cell and a second biasing signal to the biasing terminal of the second upper active sub cell in dependence on an output power of the output signal.

Further embodiments of the present invention relate to a mobile communication device.

BRIEF DESCRIPTION OF THE FIGURES

Embodiments of the present invention will be described in more detail using the accompanying figures, in which:

FIG. 1 shows a block schematic diagram of an amplifier according to an embodiment of the present invention;

FIG. 2b shows a possible implementation of the amplifier shown in FIG. 2a;

FIG. 2c shows in a block schematic diagram another possible implementation of the amplifier shown in FIG. 2a;

FIG. 2e shows another possible implementation of the amplifier shown in FIG. 2a;

FIG. 2f shows another possible implementation of the amplifier shown in FIG. 2a;

FIG. 3b shows a possible implementation of the amplifier shown in FIG. 3a;

FIG. 3c shows another possible implementation of the amplifier shown in FIG. 3a;

FIG. 4b shows a possible implementation of the amplifier shown in FIG. 4a;

FIG. 7b shows a possible implementation of the amplifier shown in FIG. 7a;

FIG. 9b shows a possible implementation of the amplifier shown in FIG. 9a;

DETAILED DESCRIPTION

Figure 2A:
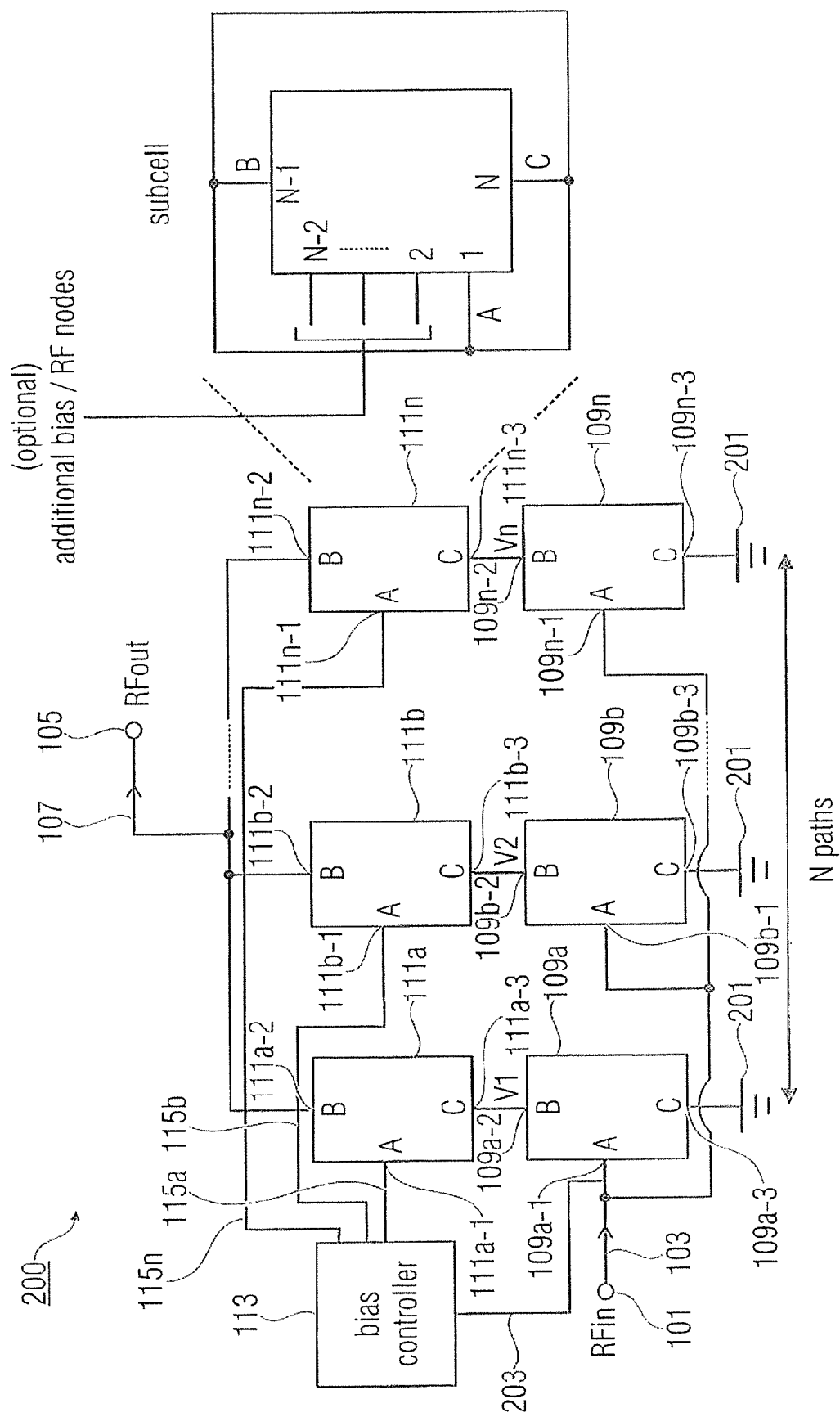
FIG. 2a shows a block schematic diagram of an amplifier according to a further embodiment of the present invention.

Before embodiments of the present invention will be described in more detail using the accompanying figures, it is to be pointed out that the same elements and functionally equal elements are provided with the same reference numbers and that a repeated description of elements having the same reference numbers is omitted. Hence, descriptions provided for elements having the same reference numbers are mutually exchangeable.

In the present application, a coupling may be a direct low ohmic coupling or an indirect coupling with one or more elements in between, such that a signal at a second node is dependent on a signal at a first node which is coupled with the second node. In other words, between two elements which are coupled with each other further elements, such as passive elements, but also active elements, such as transistors, may be arranged. Furthermore, it is also possible that two nodes or terminals which are coupled with each other are connected (directly) with each other (e.g. by means of a low ohmic conducting connection, such as a cable or a conductor path).

Furthermore, a first terminal is connected to a second terminal if a signal at the second terminal is identical to the signal at the first terminal, wherein parasitic effects or negligible losses due to conductor path impedances shall not be regarded. Hence, two terminals which are connected with each other are typically connected by means of vias or conductor paths without additional elements in between.

A first terminal of a transistor may be a source terminal or an emitter terminal. A second terminal of a transistor may be a drain terminal or a collector terminal. A control terminal of the transistor may be a gate terminal or a base terminal.

In the examples described throughout this document, the transistors are always NMOS transistors. Nevertheless, an inverted implementation (using PMOS transistors) may also be possible. Furthermore, instead of MOS transistors it is also possible to use bipolar transistors or other types of transistors.

FIG. 1 shows a block schematic diagram of an amplifier 100 according to an embodiment of the present invention.

The amplifier 100 comprises an amplifier input 101 or amplifier input terminal 101 for receiving an input signal 103. Furthermore, the amplifier 100 comprises an amplifier output 105 or amplifier output terminal 105 for providing an output signal 107. The output signal 107 may be an amplified version of the input signal 103. Furthermore, the amplifier 100 comprises a first lower active sub cell or stage 109a and a second lower active sub cell or stage 109b. The first lower active sub cell 109a comprises an input terminal 109a-1 and an output terminal 109a-2. The second lower active sub cell 109b comprises an input terminal 109b-1 and an output terminal 109b-2. The input terminal 109a-1 of the first lower active sub cell 109a and the input terminal 109b-1 of the second lower active sub cell 109b are both connected to the amplifier input 101. Furthermore, the output terminals 109a-2, 109b-2 of the first lower active sub cell 109a and the second lower active sub cell 109b are not shorted (e.g. not directly connected with each other). As an example, the output terminal 109a-2 of the first lower active sub cell 109a may take a first potential or voltage V1 and the output terminal 109b-2 of the second lower active sub cell 109b may take a second potential or voltage V2 which is different from the first potential (at one and the same point in time).

Furthermore, the amplifier 100 comprises a first upper active sub cell or stage 111a and a second upper active sub cell or stage 111b. The first upper active sub cell 111a comprises a biasing terminal 111a-1, an output terminal 111a-2 and an input terminal 111a-3. The second upper active sub cell 111b comprises a biasing terminal 111b-1, an output terminal 111b-2 and an input terminal 111b-3. The input terminals 111a-3, 111b-3 and the output terminals 111a-2, 111b-2 of the upper active sub cells 111a, 111b are coupled between the output terminals 109a-2, 109b-2 of the lower active sub cells 109a, 109b and the amplifier output 107. As an example, the output terminal 109a-2 of the first lower active sub cell 109a may be connected to the input terminal 111a-3 of the first upper active sub cell 111a. Furthermore, the output terminal 109b-2 of the second lower active sub cell 109b may be connected to the input terminal 111b-3 of the second upper active sub cell 111b. Furthermore, the output terminals 111a-2, 111b-2 of the upper active sub cells 111a, 111b may be coupled (e.g. by means of a further element, such as a further sub cell) or may be connected to the amplifier output 105.

Furthermore, the amplifier 100 comprises a bias controller 113. The bias controller 113 is configured to provide a first biasing signal 115a (or biasing potential or biasing voltage) to the biasing terminal 111a-1 of the first upper active sub cell 111a. Furthermore, the bias controller 113 is configured to provide a second biasing signal 115b (or biasing potential or biasing voltage) to the biasing terminal 111b-1 of the second upper active sub cell 111b. Furthermore, the bias controller 113 is configured to provide the first biasing signal 115a and the second biasing signal 115b based on an output power of the output signal 107 (which is provided at the amplifier output 105).

It is one aspect of embodiments of the present invention to improve the linearity of an amplifier (such as the amplifier 100) by providing the different biasing signals 115a, 115b based on the output power of the output signal 107 and therefore also based on the input power of the input signal 103 (as the output signal 107 is an amplified version of the input signal 103). By providing the different biasing signals 115a, 115b and furthermore by having the output terminals 109a-2, 109b-2 of the lower active sub cells 109a, 109b separated (not shorted) a first voltage or potential V1 can be achieved at the output terminal 109a-2 of the first lower active sub cell 109a and a second potential V2 can be achieved at the second output terminal 109b-2 of the second lower active sub cell 109b which can be different from the first potential V1. By having the possibility of adjusting these voltages or potentials V1, V2 independent from each other but still based on the output power of the output signal 107 the linearity of the amplifier 100 can be adjusted and improved when compared to systems in which such biasing is not possible.

As an example, the bias controller 113 may comprise a plurality of bias sets, each bias set comprising a potential value for the first biasing signal 115a and a potential value for the second biasing signal 115b. The bias controller 113 may choose for a given output power of the output signal 107 the bias set of the plurality of bias sets which has for this given output power the best linearity and therefore lowest intermodulation products. By dividing the amplifier 100 into two stages (each comprising a lower active sub cell and an upper active sub cell) an individual control of the linearity properties of each stage can be achieved. This leads to an overall linearity improvement of the entire circuit or amplifier 100 which can also be adapted and optimized using proper bias settings (by means of the biasing signals 115a, 115b) for a given output power level of the output signal 107. Hence, the sweet spot generated by the amplifier 100 can be shifted along a broad range of power levels. As an example, the bias controller 113 or the bias control circuit 113 may be configured to supply appropriate biasing voltages (as the biasing signals 115a, 115b) according to the mean input power of the input signal 103 and therefore based on the output power of the output signal 107.

Hence, for each output power level of the output signal 107 a bias setting for a maximum linear output power can then be chosen and the required back-off can be reduced.

The parallel stages shown in FIG. 1 possess the extra functionality of broadening the originally narrow behavior of the sweet spot of conventional amplifiers. This is achieved by the creation of successive sweet spots to use the distributed bias settings achieved by the bias controller 113. The width of this linear region depends on both the power level and the bias settings and the nature of the sub cells 109a, 109b, 111a, 111b.

Hence, one aspect of embodiments is to improve the linearity of arbitrary power amplifiers. It is suited for monolithically integrated power amplifiers including CMOS PAs. Most of the linearity improvement schemes compromise linearity enhancement with other important power amplifier performance characteristics or increased die size requirements. The proposed linearity improvement scheme aims to increase the maximum achievable linear output power from the PA without adversely affecting the other peak performance characteristics. In this respect, characteristics such as the maximum power-added efficiency (PAE), the maximum saturated output power, the power gain or the impedance levels at input and output are not degraded by the embodiments. Embodiments allow linearization of high bandwidth signals with high crest factors. No increase of die size results from embodiments when compared to conventional designs.

The goal of embodiments is then to utilize a novel linearization scheme to meet the aforementioned requirements in order to decrease the amount of back-off needed from the PA. Thus, the efficiency for a certain linearity requirement can be boosted and a longer battery-life is achieved.

According to further embodiments of the present invention the number of stages of the amplifier 100 may be arbitrary and may depend on the desired linearity performance of the amplifier 100.

To summarize, the bias controller 113 is configured to adjust a potential (e.g. the potential V1) at the input terminal 111a-3 of the first upper active sub cell 111a by means of the first biasing signal 115a and to adjust a potential (e.g. the potential V2) at the input terminal 111b-3 of the second upper active sub cell 111b by means of the second biasing signal 115b. As the input terminals 111a-3, 111b-3 of the upper active sub cells 111a, 111b are not shorted, the bias controller 113 can be configured to adjust the potential at the input terminal 111a-3 of the first upper active sub cell 111a independent from the potential at the input terminal 111b-3 of the second upper active sub cell 111b. Hence, the upper active sub cells 111a, 111b may be configured such that the potentials at their input terminals 111a-3, 111b-3 are dependent on the potential at their biasing terminal 111a-1, 111b-1. Furthermore, as already described, the bias controller 113 may be configured to apply different potentials (at one and the same time) to the biasing terminals 111a-1, 111b-1 such that for a given output power level of the output signal 107, the potential V1 at the input terminal 111a-3 of the first upper active sub cell 111a is different from the potential V2 at the input terminal 111b-3 of the second upper active sub cell 111b, thereby achieving a large variety of different bias sets for different output power levels of the output signal 107.

As an example, the bias controller 113 may be configured to receive a control signal indicating the output power of the output signal 107 based on which the bias controller 113 adjusts the biasing signals or biasing voltages 115a, 115b. The control signal may be derived based on the mean input power of the input signal 103 and/or by measuring the power of the output signal 107 provided at the amplifier output 105.

FIG. 2a shows a block schematic diagram of an amplifier 200 according to a further embodiment of the present invention. The amplifier 200 differs from the amplifier 100 in the fact that it comprises N stages or paths wherein each of these stages comprises a lower active sub cell 109a to 109n and an upper active sub cell 111a to 111n. Hence, in the example shown in FIG. 1 N=2.

Furthermore, each of the lower active sub cells 109a to 109n comprises a supply terminal 109a-3 to 109n-3 which is connected to a reference potential terminal (e.g. ground potential terminal) 201 of the amplifier 200.

Furthermore, the bias controller 113 is configured to provide to each of the upper active sub cells 111a to 111n a biasing signal 115a to 115n based on the output power of the output signal 107.

As in the example shown in FIG. 1, the input terminals 111a-3 to 111n-3 of the upper active sub cells 111a-111n are not shorted. Furthermore, the output terminals 109a-2 to 109n-2 of the lower active sub cells 109a to 109n are also not shorted. Hence, the bias controller 113 may be configured to adjust the linearity property of each of the stages independent from the other stages. Furthermore, as can be seen in FIG. 2a, each sub cell may even comprise a plurality of additional biasing terminals or input terminals.

Furthermore, according to further embodiments of the present invention, different upper active sub cells may be different from each other. Accordingly, different lower active sub cells may also be different from each other.

Furthermore, the bias controller 113 may be configured to provide a further biasing signal 203 to the amplifier input 101 (e.g., based on the maximum output power of the output signal 107).

Figure 2B:
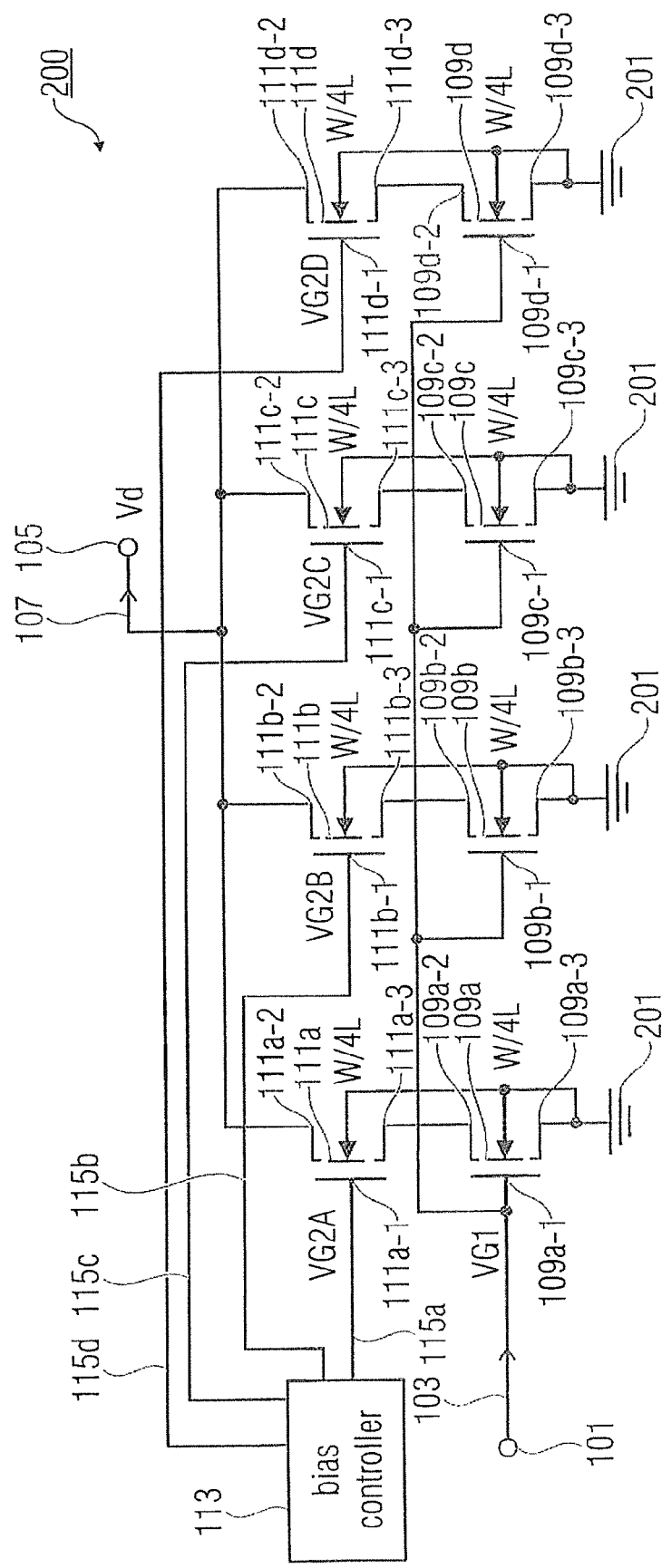

A possible implementation of the amplifier 200 with N=4 is shown in FIG. 2b with four parallel cascodes (each comprising a lower active sub cell and an upper active sub cell).

As can be seen in FIG. 2b a lower active sub cell (e.g. the first lower active sub cell 109a) is implemented as a lower transistor 109a and an upper active sub cell (e.g. the first upper active sub cell 111a) is implemented as an upper transistor 111a. The same applies to the other sub cells 109b to 109d, 111b to 111d. The lower transistor 109a to 109d and the upper transistor 111a to 111d of each stage are connected as cascodes. Control terminals 109a-1 to 109d-1 of the lower transistors 109a to 109d are connected to the amplifier input 101 (for receiving the input signal 103).

Control terminals 111a-1 to 111d-1 of the upper transistors 111a to 111d (forming the biasing terminals 111a-1 to 111d-1 of the upper active sub cells 111a to 111d) are connected to the bias controller 113 for receiving the biasing signals 115a to 115d.

Each of the cascodes is constructed as the following. A first terminal 109a-3 to 109d-3 of the lower transistors 109a to 109d is connected to the ground potential terminal 201. A second terminal 109a-2 to 109d-2 of the lower transistors 109a to 109d is connected to a first terminal 111a-3 to 111d-3 of the upper transistors 111a to 111d. A second terminal 111a-2 to 111d-2 of the upper transistors 111a to 111d is connected to the other second terminals 111a-2 to 111d-2 of the other upper transistors 111a to 111d and the amplifier output 105.

In the example shown in FIG. 2b the lower transistors 109a to 109d have equal gate widths. Furthermore, the upper transistors 111a to 111d have equal gate widths. Nevertheless, according to further embodiments gate widths of different transistors may differ.

To summarize, the amplifier 200 is based on using cascodes as they provide advantages over the basic common source amplifier through the cascoding of a common gate device (the upper transistors 111a to 111d) upon the common source device (the lower transistors 109a to 109d) at the amplifier input 101. Consequently, higher voltage operation is possible which is important for low breakdown voltage technologies such as nanometer CMOS technology. Furthermore, the power gain is boosted due to the larger output resistance, and the feedback from output to input node is reduced.

In its simplest form an embodiment of the present invention may comprise only two cascodes (e.g. formed by the lower transistors 109a and 109b and the upper transistors 111a and 111b).

In the case shown in FIG. 2b a special implementation of embodiments of the present invention is shown where the power stage (the amplifier 200) comprises the four cascodes in parallel which have together the same total gate width as would be used with no segmentation. As already mentioned, the four cascodes may have the same gate width or may have different gate width depending on the special design goals.

Dividing the cascodes allows individual control of the linearity properties of each part. This leads to an overall linearity improvement of the entire circuit which can also be adapted and optimized using proper bias settings for a given output power level of the output signal 107. The sweet spot generated by the amplifier 200 can be shifted along a broad range of power levels.

Furthermore, the amplifier output 105 may be connected to a supply voltage terminal Vd.

To summarize, switchable paths of the lower transistors 109a to 109d are connected between the ground potential terminal 201 and the input terminals 111a-3 to 111d-3 of the upper active sub cells 111a to 111d. Furthermore, switchable paths of the upper transistor 111a to 111d are connected between the input terminals 111a-3 to 111d-3 of the upper active sub cells 111a to 111d and the output terminals 111a-2 to 111d-2 of the upper active sub cells 111a to 111d.

Figure 2C:
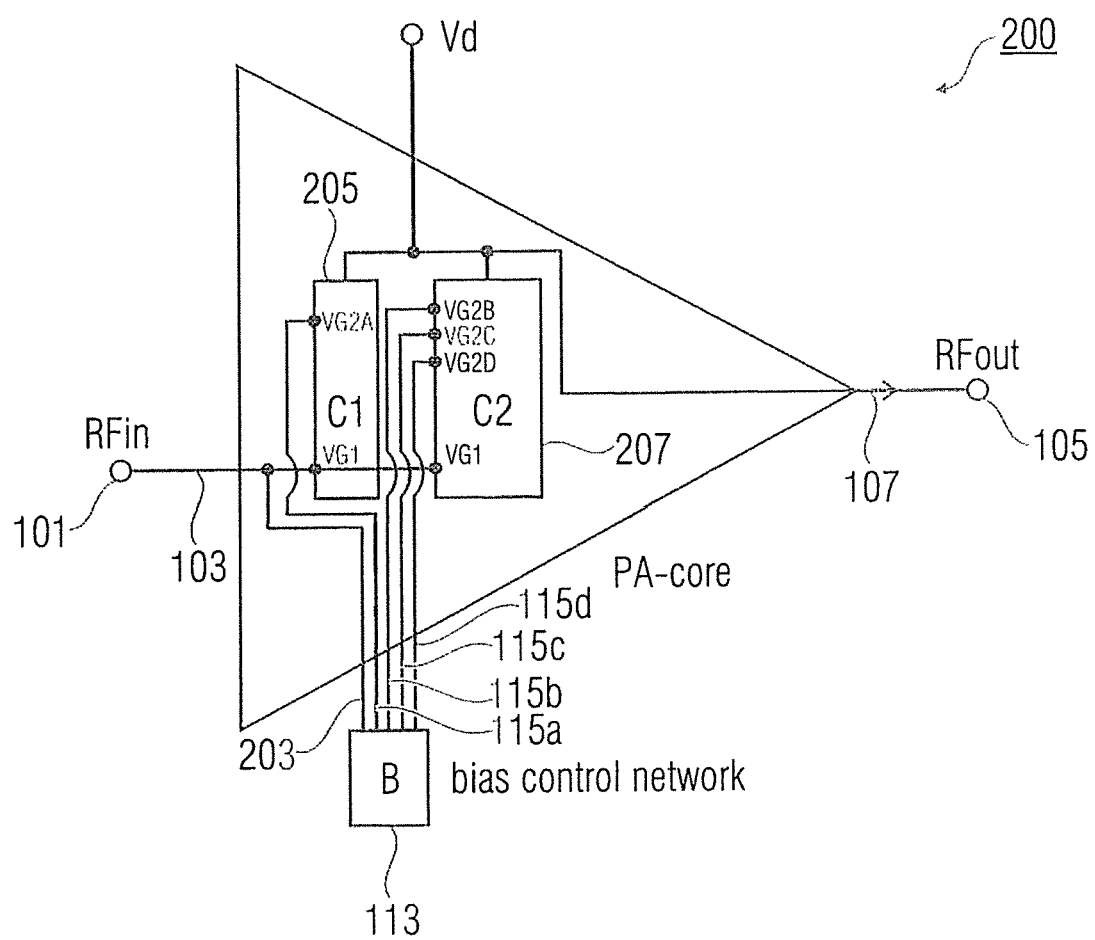

FIG. 2c shows another implementation of the amplifier shown in FIG. 2a which differs from the implementation shown in FIG. 2b in that a primary gain cascode 205 and a parallel linearizing cascode bank 207 are implemented. Hence, the primary gain cascode 205 is implemented primarily for amplifying the input signal 103 and the parallel linearizing cascode bank 207 is implemented for adjusting the linearity properties of the amplifier 200 based on the output power of the output signal 107 by means of the biasing signals 115b to 115d.

Figure 2D:
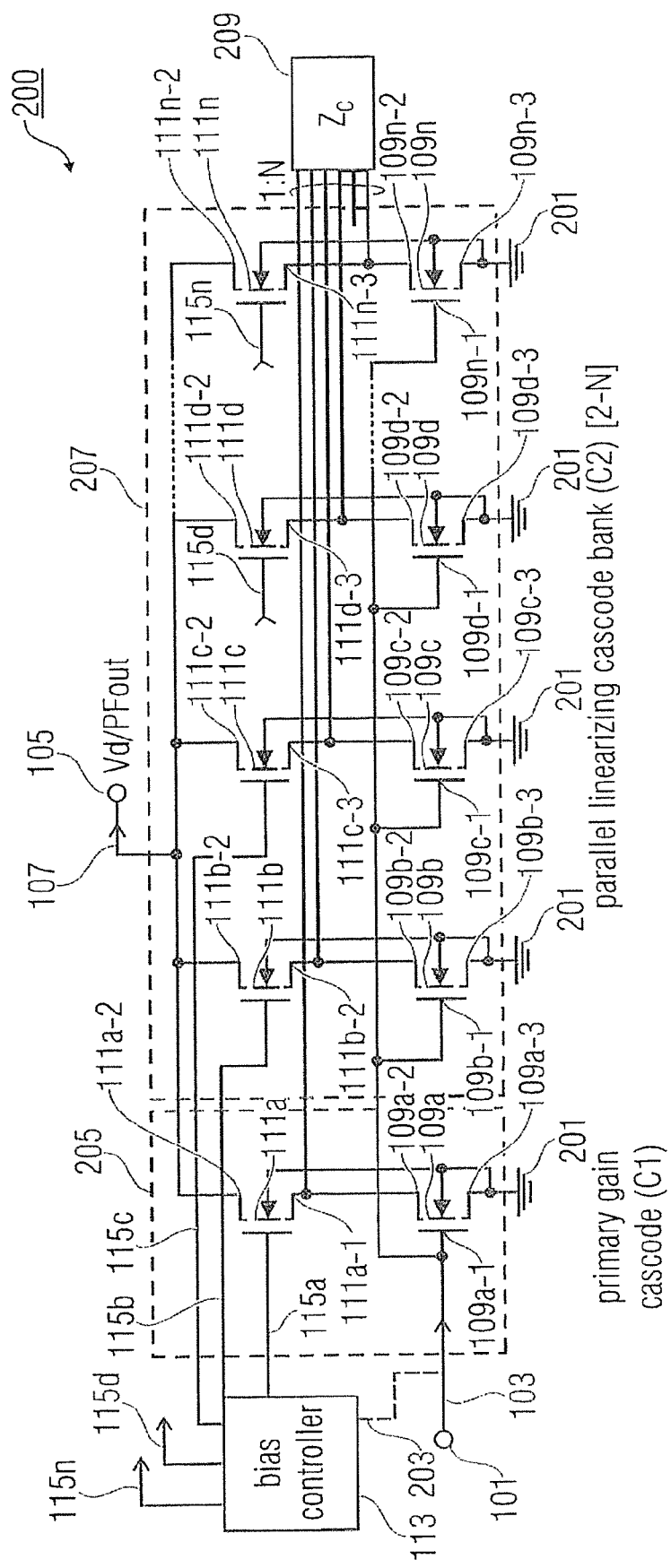
FIG. 2d shows a possible implementation of the amplifier shown in FIG. 2c.

FIG. 2d shows in a schematic a possible implementation of the concept shown in FIG. 2c.

The primary gain cascode 205 comprises the first lower transistor 109a and the first upper transistor 111a. The parallel linearizing cascode bank 207 comprises the lower transistors 109b to 109n and the upper transistors 111b to 111n, each pair of a lower transistor 109b to 109n and an upper transistor 111b to 111n forms a linearizing cascode, wherein the lower transistor 109b to 109n of each linearizing cascode receives the input signal 103 and each upper transistor 111b to 111n of each cascode receives its own biasing signal 115b to 115n from the bias controller 113.

The main cascode or the primary gain cascode 205 is present as the primary amplifying core which delivers the required high power gain for amplifying the input signal 103. The parallel linearizing cascode bank 207 is added with its drains 111b-2 to 111n-2 (or its output terminals 111b-2 to 111n-2) connected to the drain 111a-2 (or the output terminal 111a-2) of the primary gain cascode 205. The current source devices (the lower transistors 109b to 109n) share the RF input 103 from the main common source device 109a of the primary gain cascode 205. As can be seen, the number of secondary cascodes (implemented in the parallel linearizing cascode bank 207) can be varied up to N cascodes and the size of each cascode can be different according to the linearity specification to be met. Increasing the number of parallel secondary cascodes increases the maneuverability of the circuit at the expense of extra complexity.

Furthermore, the amplifier 200 comprises an optional coupling impedance (e.g. an optional impedance network) 209 which is connected to each of the cascodes of the amplifier 200. In the example shown in FIG. 2d the first terminals 111a-1 to 111n-1 of the upper transistors 111a to 111n are connected to the coupling impedance 209. By having the coupling impedance 209 connected to the cascodes of the amplifier 200 linearity properties of the amplifier 200 can be further improved.

To summarize, the amplifier or power amplifier 200 is composed of the primary gain cascode 205 and the parallel linearizing cascode bank 207. All cascodes are connected in parallel at the drain of the common gate devices. The bias block or bias controller 113 generates the necessary bias voltages 115a to 115n for the common gate devices (for the upper transistors 111a to 111n). Furthermore, the bias controller 113 may generate a further biasing signal 203 which is applied to the amplifier input 101.

Bulk terminals or substrate terminals of the transistors 109a to 109n, 111a to 111n are all connected to the ground potential terminal 201. According to further embodiments, the bulk terminals or substrate terminals of the transistors 109a to 109n, 111a to 111n may be connected to one or more other potential terminal(s) at which a potential is provided which is at maximum equal to a potential at a source terminal of a respective transistor 109a to 109n, 111a to 111n (e.g. for the purpose of threshold voltage manipulation). Hence, it is even possible that a non-constant potential (e.g. an RF potential) is applied to one or more of the bulk terminals or substrate terminals of the transistors 109a to 109n, 111a to 111n.

As the primary gain cascode 205 acts as an amplifying cascode 205 and the cascodes of the parallel linearizing cascode bank 207 act as linearizing cascodes, a gate width of the transistors 109a, 111a of the primary gain cascode 205 may be different than a gate width of the transistors 109b to 109n, 111b to 111n of the parallel linearizing cascode bank 207.

Figure 2E:
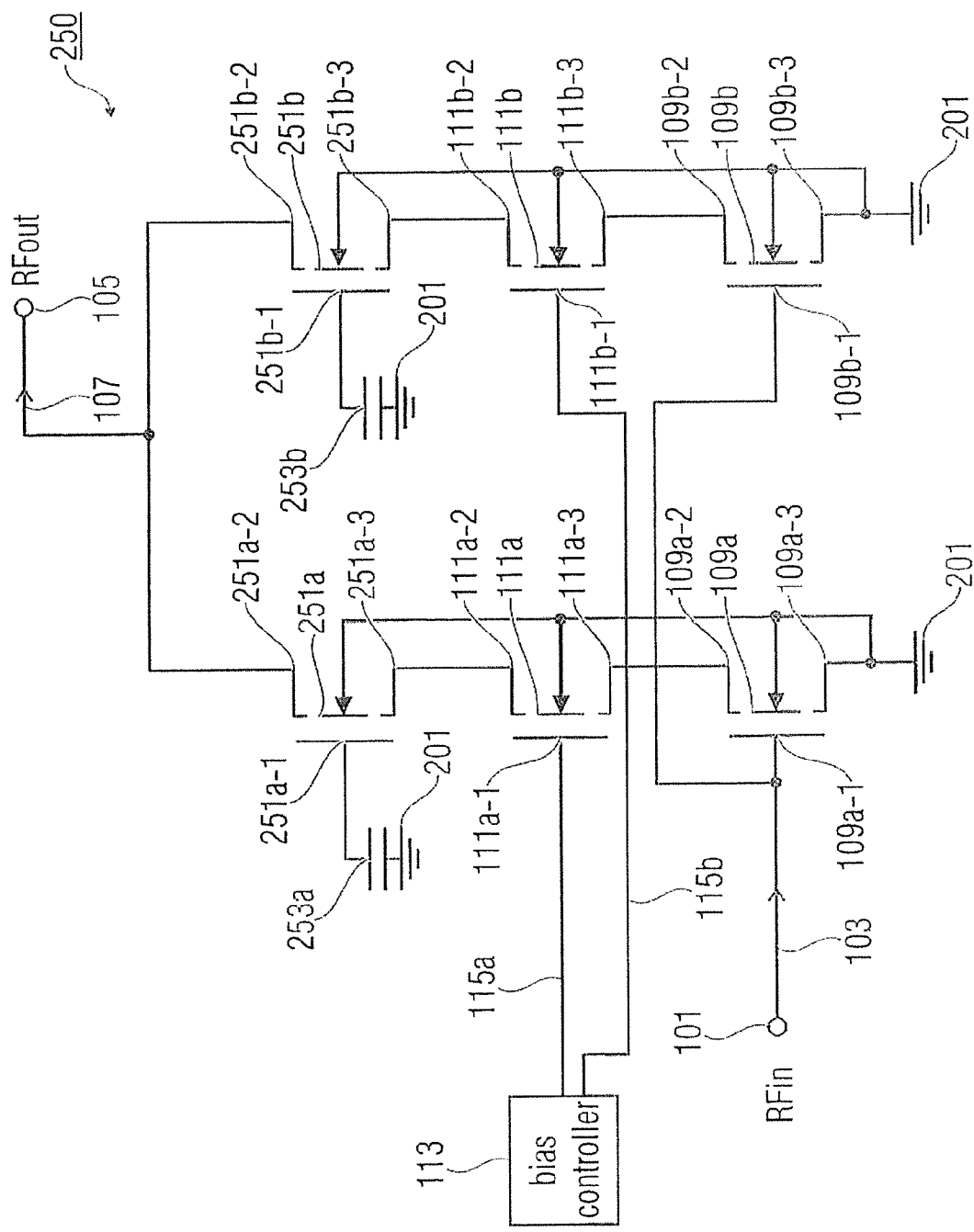

FIG. 2e shows as a possible extension of the amplifier 200 shown in FIG. 2a an amplifier 250 according to an embodiment of the present invention in which two additional active sub cells 251a, 251b are added between the output terminals 111a-2, 111b-2 of the upper active sub cells 111a, 111b and the amplifier output 105. As can be seen in FIG. 2e the lower active sub cells 109a, 109b and the upper active sub cells 111a, 111b are implemented as transistors 109a, 109b, 111a, 111b (as already described in conjunction with FIGS. 2b and 2d). Furthermore, the additional active sub cells 251a, 251b are implemented as transistors. A first terminal 251a-3 of a first additional transistor (forming the first additional active sub cell 251a) is connected to the output terminal 111a-2 of the first upper active sub cell 111a and therefore to the second terminal 111a-2 of the first upper transistor 111a. A second terminal 251a-2 of the first additional transistor 251a is connected to the amplifier output 105. Furthermore, a first terminal 251b-3 of the second additional transistor 251b (forming the second additional active sub cell 251b) is connected to the output terminal 111b-2 of the second lower active sub cell 111b and therefore to the second terminal 111b-2 of the second upper transistor 111b. A second terminal 251b-2 of the second additional transistor 251b is connected to the amplifier output 105. Furthermore, a control terminal 251a-1 of the first additional transistor 251a is connected to a first terminal of a shunt capacitance 253a. A control terminal 251b-1 of the second additional transistor 251b is connected to a first terminal of a second shunt capacitance 253b. Second terminals of the shunt capacitances 253a, 253b are connected to the ground potential terminal 201. By having the additional transistors or additional active sub cells 251a, 251b between the output terminals 111a-2, 111b-2 of the upper active sub cells 111a, 111b and the amplifier output 105 a linearity property of the amplifier 250 can be further improved. To summarize, not all active sub cells which are coupled between the amplifier input 101 and the amplifier output 105 need necessarily receive a biasing signal from the bias controller 113. Rather, it is also possible that biasing terminals (such as the control terminals 251a-1, 251b-1) are pulled to a constant potential.

To summarize, a switchable path of the first additional transistor 251a is connected between the output terminal 111a-2 of the first upper active sub cell 111a and the amplifier output 105. A switchable path of the second additional transistor 251b is coupled between the output terminal 111b-2 of the second upper active sub cell 111b and the amplifier output 105.

According to further embodiments, the first additional active sub cell 251a and the first upper active sub cell 211a may be integrated into one common first upper active sub cell. Furthermore, also the second additional active sub cell 251b and the second upper active sub cell 111b may be integrated into one common second upper active sub cell.

Furthermore, in the embodiment shown in FIG. 2e bulk terminals or substrate terminals of the additional transistors 251a, 251b are connected to the ground potential terminal 201. Nevertheless, as already described before, also other potentials may be applied to the bulk terminals or substrate terminals of the additional transistors 251a, 251b, as it is shown (as just one possible example) in FIG. 2f.

Figure 2F:
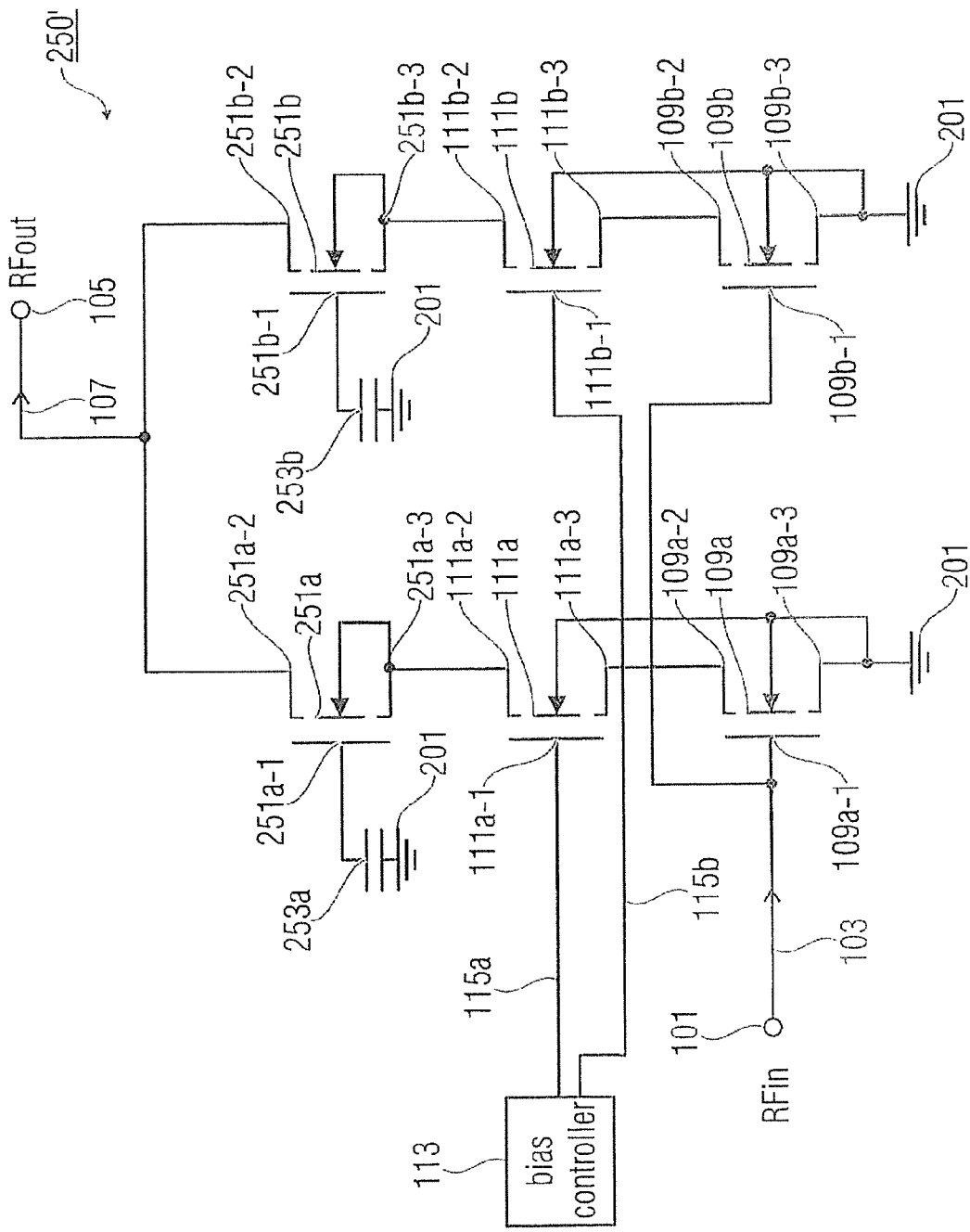
Figure 3A:
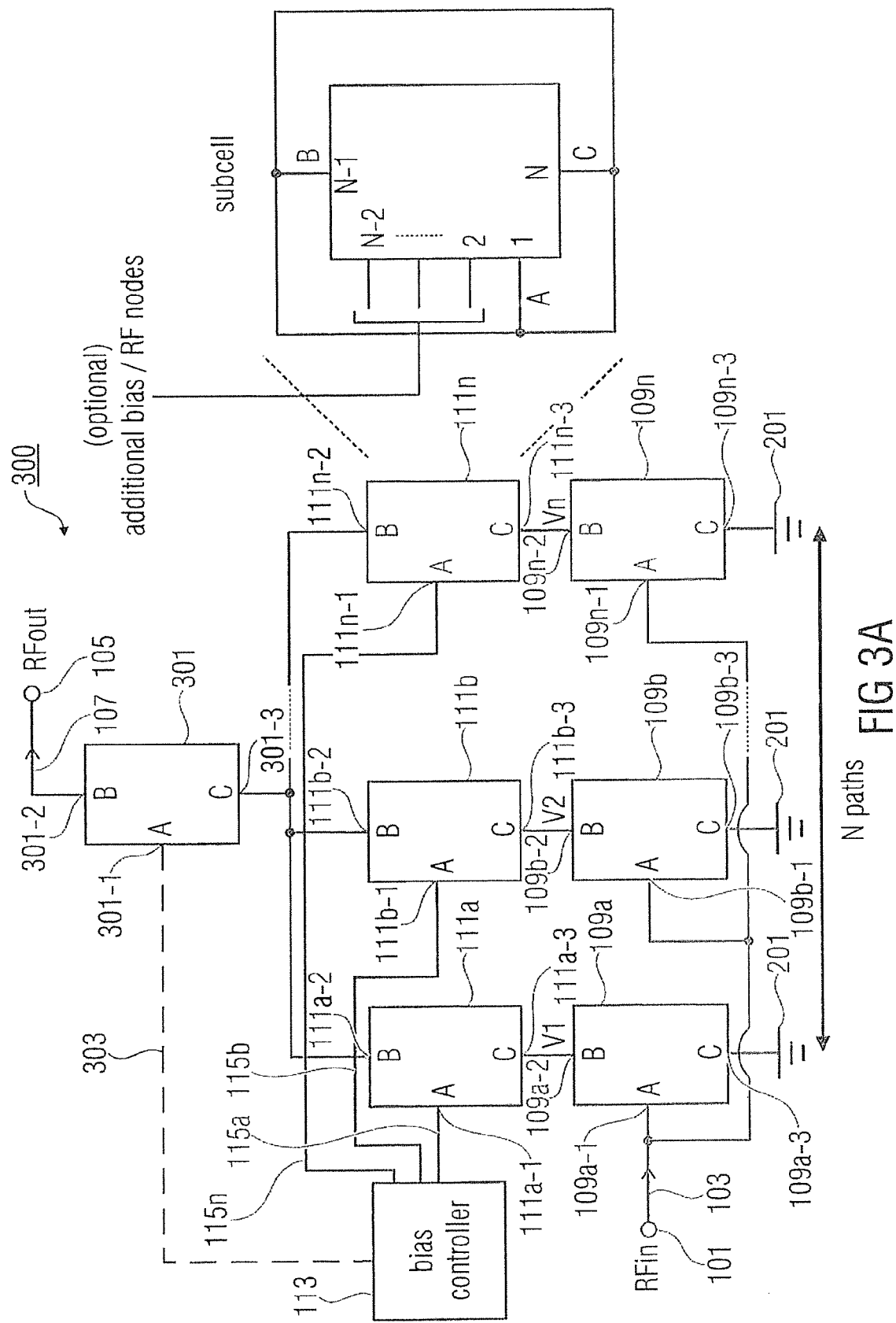
FIG. 3a shows a block schematic diagram of an amplifier according to a further embodiment of the present invention.

FIG. 2f shows an amplifier 250' according to a further embodiment of the present invention which differs from the amplifier 250 in that the bulk terminals or substrate terminals of the additional transistors 251a, 251b are connected to their first terminals 251a-3, 251b-3 (which may be Source terminals). Or in other words, the bulk terminal or substrate terminal of the first additional transistors 251a is connected to the first terminal 251a-3 of the first additional transistor 251a and the bulk terminal or substrate terminal of the second additional transistors 251b is connected to the first terminal 251b-3 of the second additional transistor 251b, FIG. 3a shows an amplifier 300 according to a further embodiment of the present invention. The amplifier 300 differs from the amplifier 200 shown in FIG. 2a in that a further active sub cell 301 is connected between the output terminals 111a-2 to 111n-2 of the upper active sub cell 111a to 111n and the amplifier output 105. In other words, an input terminal 301-3 of the further active sub cell 301 is connected to the output terminals 111a-2 to 111n-2 of the upper active sub cells 111a to 111n. Furthermore, an output terminal 301-2 of the further active sub cell 301 is connected to the amplifier output 105 of the amplifier 300. Furthermore, according to some embodiments of the present invention, the further active sub cell 301 may comprise a biasing terminal 301-1 at which it receives a further biasing signal 303 from the bias controller 113. Nevertheless, there are also implementations feasible in which the further active sub cell 301 does not comprise at all such a biasing terminal 301-1 or in which such a biasing terminal 301-1 is not connected to the bias controller 113, e.g. if it is pulled to a predetermined potential (e.g. as shown in conjunction with the additional sub cells 251a, 251b of the amplifier 250 in FIG. 2e).

Figure 3B:
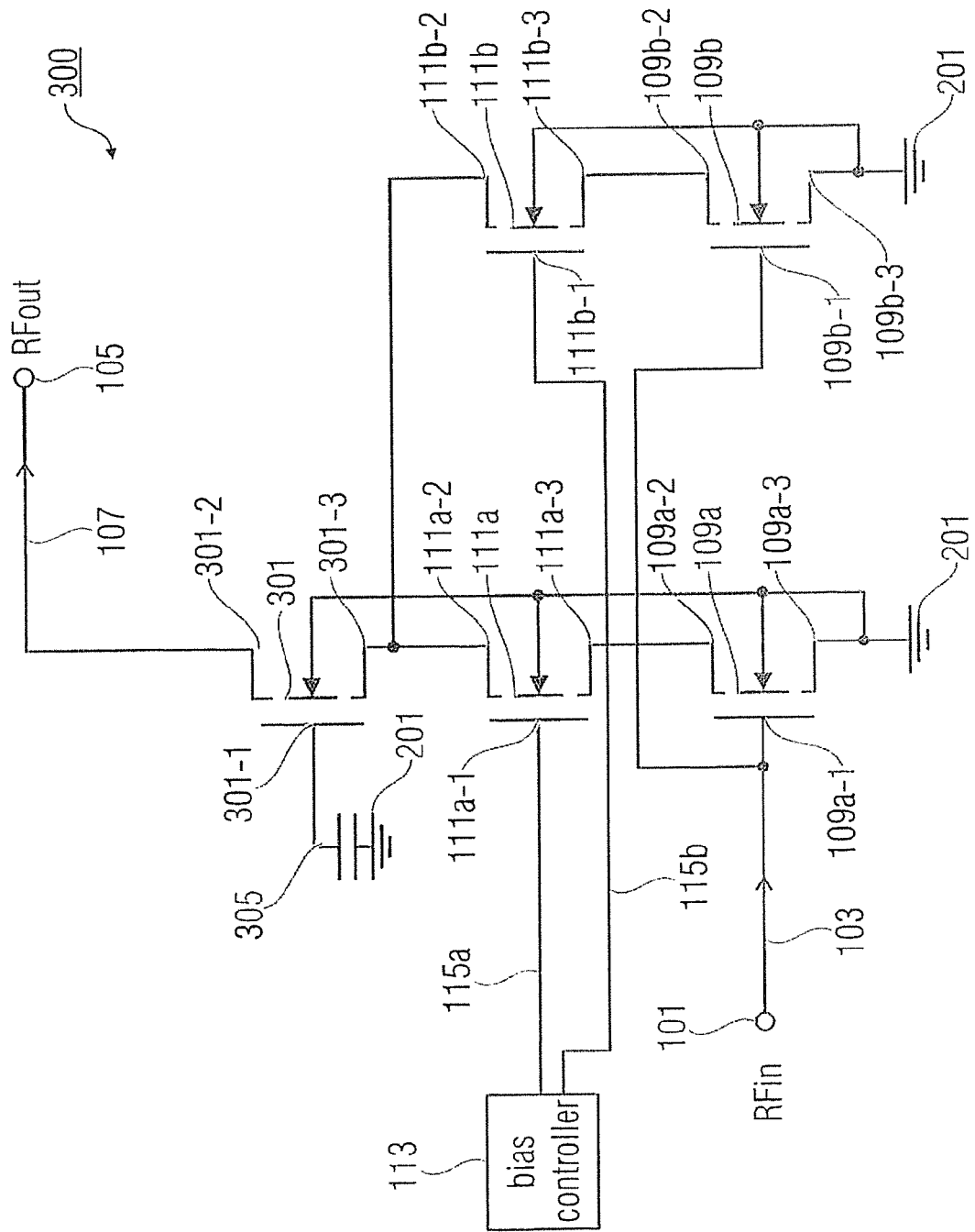

FIG. 3b shows a possible implementation of the amplifier 300 shown in FIG. 3a.

The implementation of the amplifier 300 shown in FIG. 3b differs from the implementation of the amplifier 250 shown in FIG. 2e in that the second terminals 111a-2, 111b-2 of the upper transistors 111a, 111b are both connected to the input terminal 301-3 of the further active sub cell 301 and therefore to a first terminal 301-3 of a further transistor 301 forming the further active sub cell 301. Hence, in contrast to the amplifier 250 the amplifier 300 comprises only one transistor 301 or in general one further active sub cell 301 which is connected between the second terminals 111a-2, 111b-2 of the upper transistors 111a, 111b and the amplifier output 105. A second terminal 301-2 of the further transistor 301 is connected to the amplifier output 105 and a control terminal 301-1 of the further transistor 301 is connected to a first terminal of a shunt capacitance 305. A second terminal of the shunt capacitance 305 is connected to the ground potential terminal 201. As can be seen in FIG. 3b, the bias controller 113 does not provide a biasing signal to the control terminal 301-1 of the further transistor 301. Hence, the further active sub cell 301 does not receive a biasing signal from the bias controller 113.

To summarize, a switchable path of the further transistor 301 is connected between the output terminals 111a-2, 111b-2 of the two upper active sub cells 111a, 111b and the amplifier output 105.

Figure 3C:
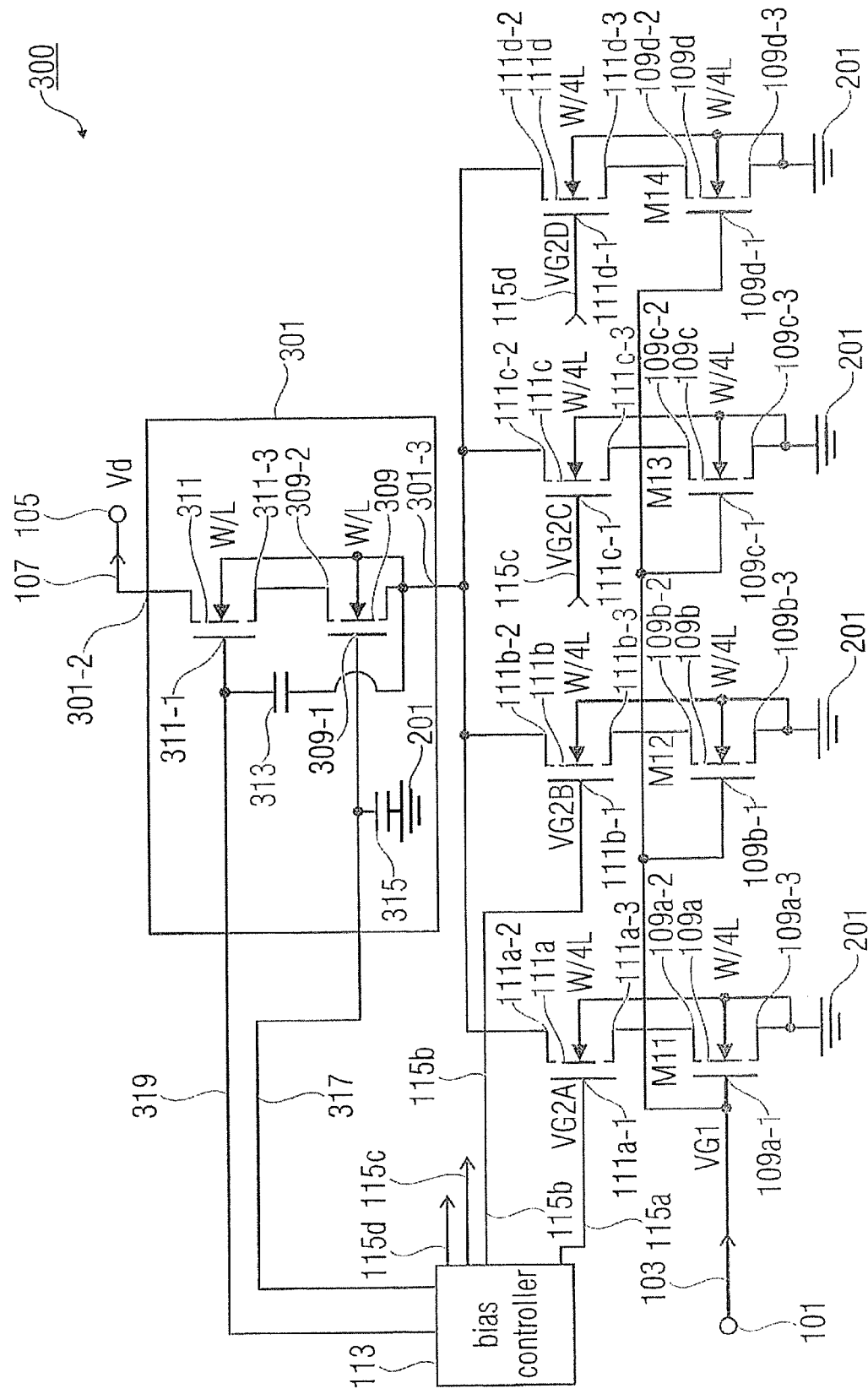

FIG. 3c shows another possible implementation of the amplifier 300 in which the further active sub cell 301 comprises a cascode formed by a first additional transistor or lower cascode transistor 309 and a second additional transistor or upper cascode transistor 311. In other words, the implementation of the amplifier 300 shown in FIG. 3 extends the implementation of the amplifier 200 shown in FIG. 2b by the further active sub cell 301 (comprising the cascode formed by the two additional transistors 309, 311). The input terminal 301-3 of the further active sub cell 301 is connected to the second terminals 111a-2 to 111d-2 of the upper transistors 111a to 111d.

Furthermore, the further active sub cell 301 comprises a first biasing terminal 309-1 and a second biasing terminal 311-1. The first biasing terminal 309-1 is a control terminal of the further additional transistor 309 and the second biasing terminal 311-1 of the further active sub cell 301 is a control terminal of the second additional transistor 311. A first terminal of the first additional transistor 309 forms the input terminal 301-3 of the further active sub cell 301. A second terminal 309-2 of the first additional transistor 309 is connected to a first terminal 311-3 of the second additional 311. A second terminal of the second additional transistor 311 forms the output terminal 301-2 of the further active sub cell 301 and is therefore connected to the amplifier output 105. Furthermore, the further active sub cell 301 comprises a feedback capacitance 313 which is connected between the control terminal 311-1 of the second additional transistor 311 and the input terminal 301-3 of the further active sub cell 301. Furthermore, the further active sub cell 301 comprises a shunt capacitance 315 which is connected between the control terminal 309-1 of the first additional transistor 309 and the ground terminal 201. Furthermore, the bias controller 113 is configured to provide a first additional biasing signal 317 to the control terminal 309-1 of the first additional transistor 309 and a second additional biasing signal 319 to the control terminal 311-1 of the second additional transistor 311.

To summarize, switchable paths of the lower cascode transistor 309 and the upper cascode transistor 311 of the further active sub cells 301 or of the cascode 301 are connected between the output terminals 111a-2 to 111d-2 of the upper active sub cells 111a to 111d and the amplifier output 105.

Furthermore, the bias controller 113 is configured to provide the additional biasing signals 317, 319 to the control terminals 309-1, 311-1 of the transistors 309, 311 based on the output power of the output signal 107.

As can be seen from FIG. 3c, a sum of the gate widths of the lower transistors 109a to 109d and a sum of the gate widths of the upper transistors 111a to 111d equal a gate width of each of the additional transistors 309, 311. According to further embodiments this relationship may be different and may vary based on the output power and efficiency demands.

According to further embodiments, the lower part of the amplifier 300 (the lower transistors 109a to 109d and the upper transistors 111a to 111d) may be implemented as shown in conjunction with FIG. 2d. As an example, the lower transistor 109a and the upper transistor 111a may form a primary gain cascode and the other transistors 109b to 109d, 111b to 111d may form a parallel linearizing cascode bank.

To summarize, FIG. 3c shows as an example of the flexibility of embodiments of the present invention a linearized stacked cascode structure with four parallel cascodes (formed by the transistors 109a to 109d, 111a to 111d) and the further cascode 301. In other words, the linearized cascode structure formed by the transistors 109a to 109d, 111a to 111d is incorporated as an input cascode stage in the high ruggedness high efficiency power amplifier 300. The transistors 309, 311 form a stacked cascode 301 which reduces the voltage stress across the original cascode and allows the use of higher drain bias voltages and thus higher saturated output power can be reached. Hence, embodiments of the present invention show a high flexibility to replace input stages of ordinary or conventional power amplifiers in order to improve cell linearity.

Dividing the cascodes allows individual control of the linearity properties of each part (of each cascode formed by a lower transistor 109a to 109d and an upper transistor 111a to 111d). This leads to an overall linearity improvement of the entire circuit 300 which can also be adapted and optimized using proper bias settings (by means of proper biasing signals 115a to 115d, 317, 319) for a given output power level of the output signal 107. The sweet spot generated by the amplifier 300 can be shifted along a broad range of power levels as shown in FIG. 10a.

Figure 10A:
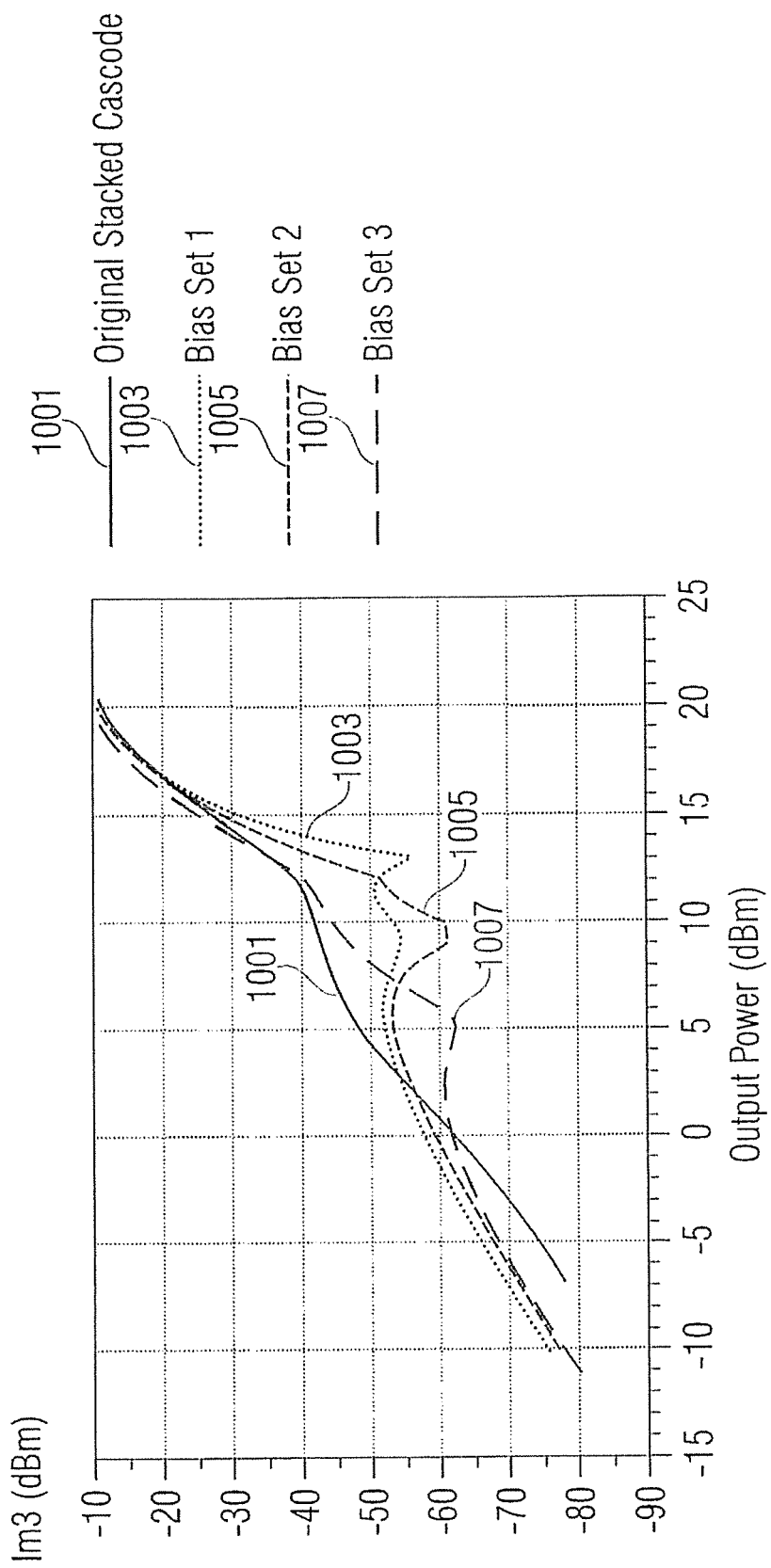
FIG. 10a is a graph illustrating a third order intermodulation product against output power for different common gate bias voltage settings.

FIG. 10a shows the third order intermodulation (IM3) (dBm) product against output power (dBm) for different common gate bias voltage settings for a 5 KHz spaced two-tone Harmonic Balance Simulation centered at 900 MHz for the implementation of the amplifier 300 shown in FIG. 3. FIG. 10a shows in a first curve 1001 the third order intermodulation product against output power for a conventional stacked cascode, in a second curve 1003 the third order intermodulation product against output power for a first bias set, in a third curve 1005 a third order intermodulation product against output power for a second bias set and in a fourth curve 1007 the third order intermodulation product against an output power for a third bias set.

Each of the bias sets may comprise a potential or voltage for each of the biasing signals 115a to 115d, 317, 319. As can be seen from FIG. 10a, by using embodiments of the present invention even for a high output power of the output signal 107 a high linearity and therefore a low third order intermodulation product of the amplifier 300 can be achieved (for example using for this high output power the first bias set).

The appropriate biasing voltages defined by the bias sets are applied by the bias control circuit or bias controller 113.

Figure 10B:
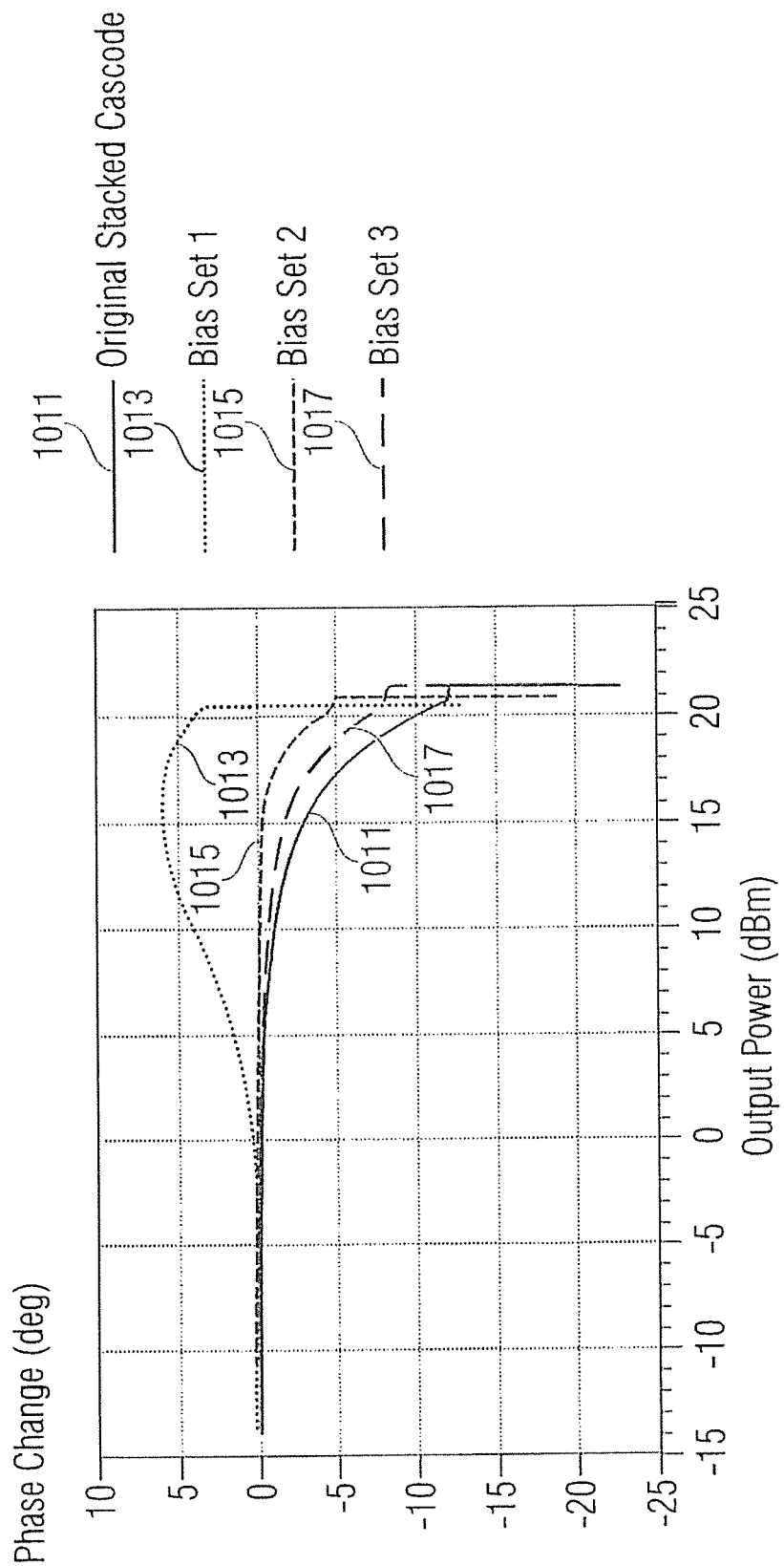
FIG. 10b is a graph illustrating an output phase variation against output power for the different common gate bias voltage settings.
Figure 10C:
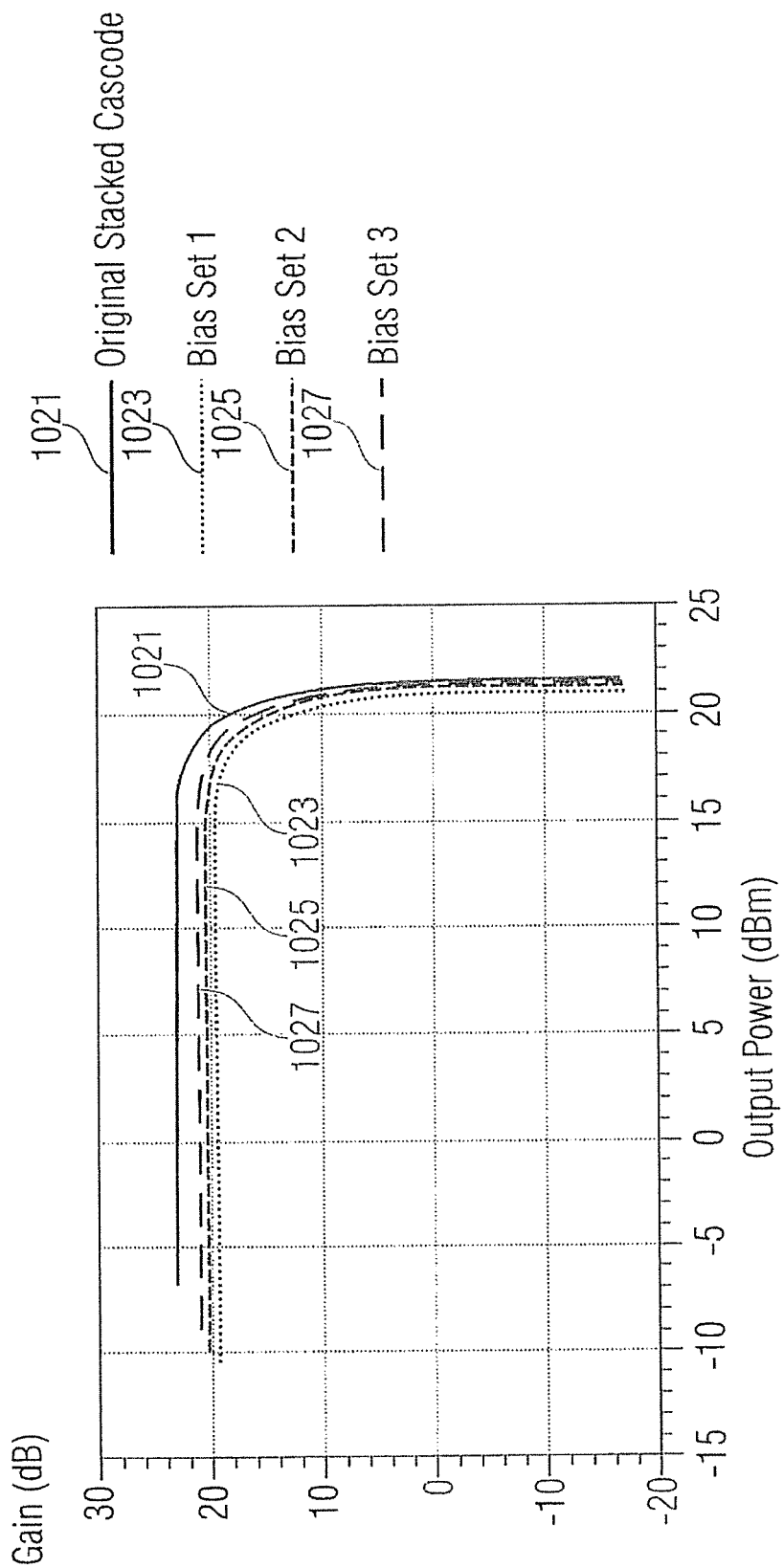
FIG. 10c is a graph illustrating a power amplifier gain against output power for the different common gate bias voltages.

The corresponding adjustable phase and amplitude responses are shown in FIGS. 10b and 10c respectively. FIG. 10b shows output phase variation (deg) against output power (dBm) for different gate bias voltage settings (in a first curve 1011 for a conventional stacked cascode, in a second curve 1013 for the first bias set, in a third curve 1015 for the second bias set and in a fourth curve 1017 for the third bias set).

FIG. 10c shows the power amplifier gain (dB) against output power (dBm) for different common gate bias voltages (in a first curve 1021 for the conventional stacked cascode, in a second curve 1023 for the first bias set, in a third curve 1024 for the second bias set and in a fourth curve 1027 for the third bias set).

The bias controller 113 may be configured to choose a bias setting for a maximum linear output power and required back-off can be reduced. In other words, the bias controller 113 may be configured to choose for a given output power level the bias set out of a plurality of bias sets which exhibits for this given output power the highest linearity and therefore the lowest third order intermodulation product.

Figure 10D:
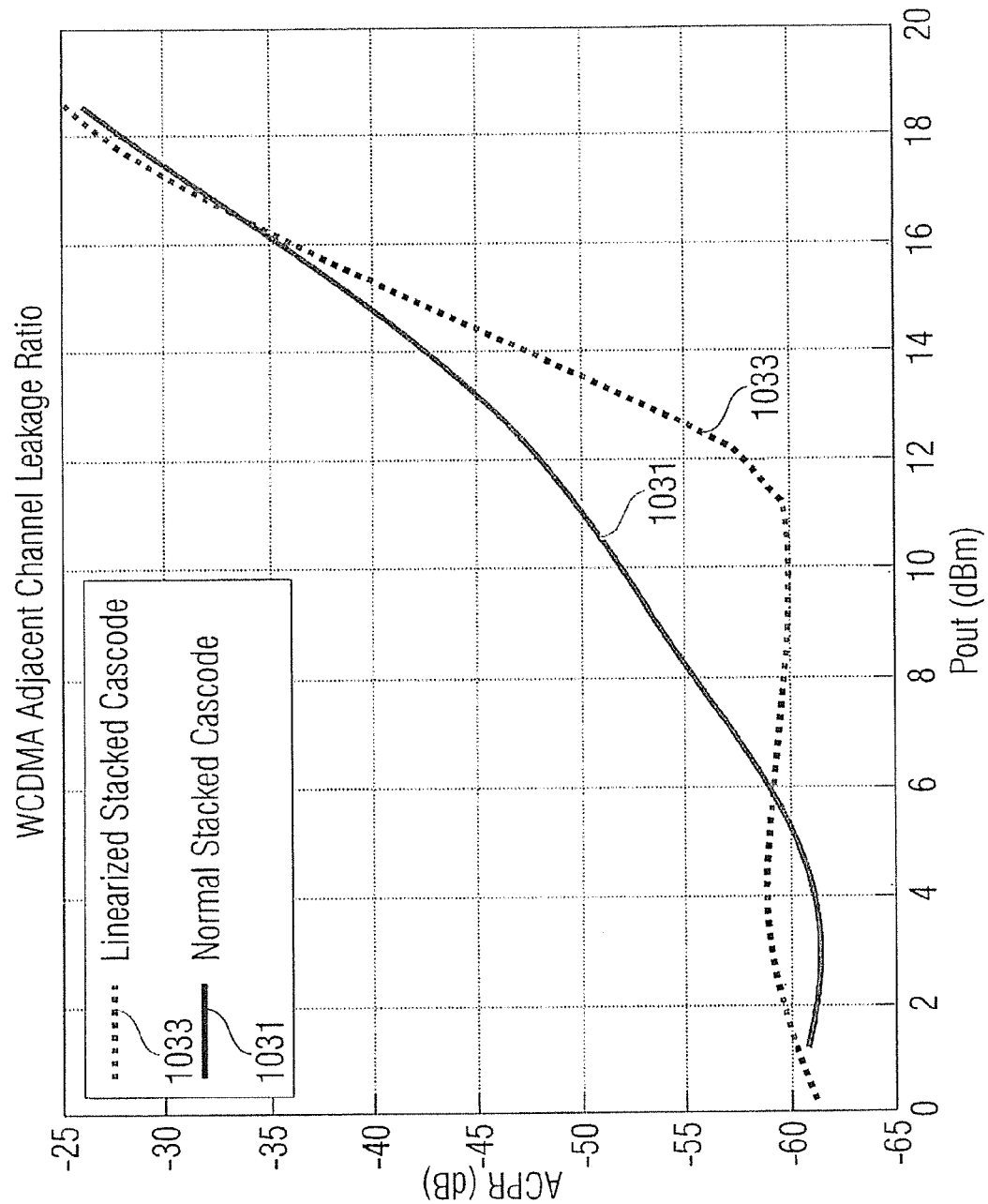
FIG. 10d is a graph illustrating an adjacent channel power ratio against average output power for a linearized stacked cascode according to an embodiment of the present invention and a conventional stacked cascode.

Furthermore, the adjacent channel power ratio (ACPR) can be improved by embodiments of the present invention as shown in FIG. 10d.

FIG. 10d shows in a diagram the comparison of the adjacent channel power ratio over output power for W-CDMA signal with 3.48 dB crest factor for a conventional stacked cascode (in a first curve 1031) and for a linearized stacked cascode according to embodiments of the present invention (in a second curve 1033). From FIG. 10d it can be seen that the maximum linear output power of a W-CDMA driven signal is increased by 0.7 dB at −40 dB ACPR. The ACPR is also reduced at lower average output powers when compared to conventional power amplifiers.

Figure 4A:
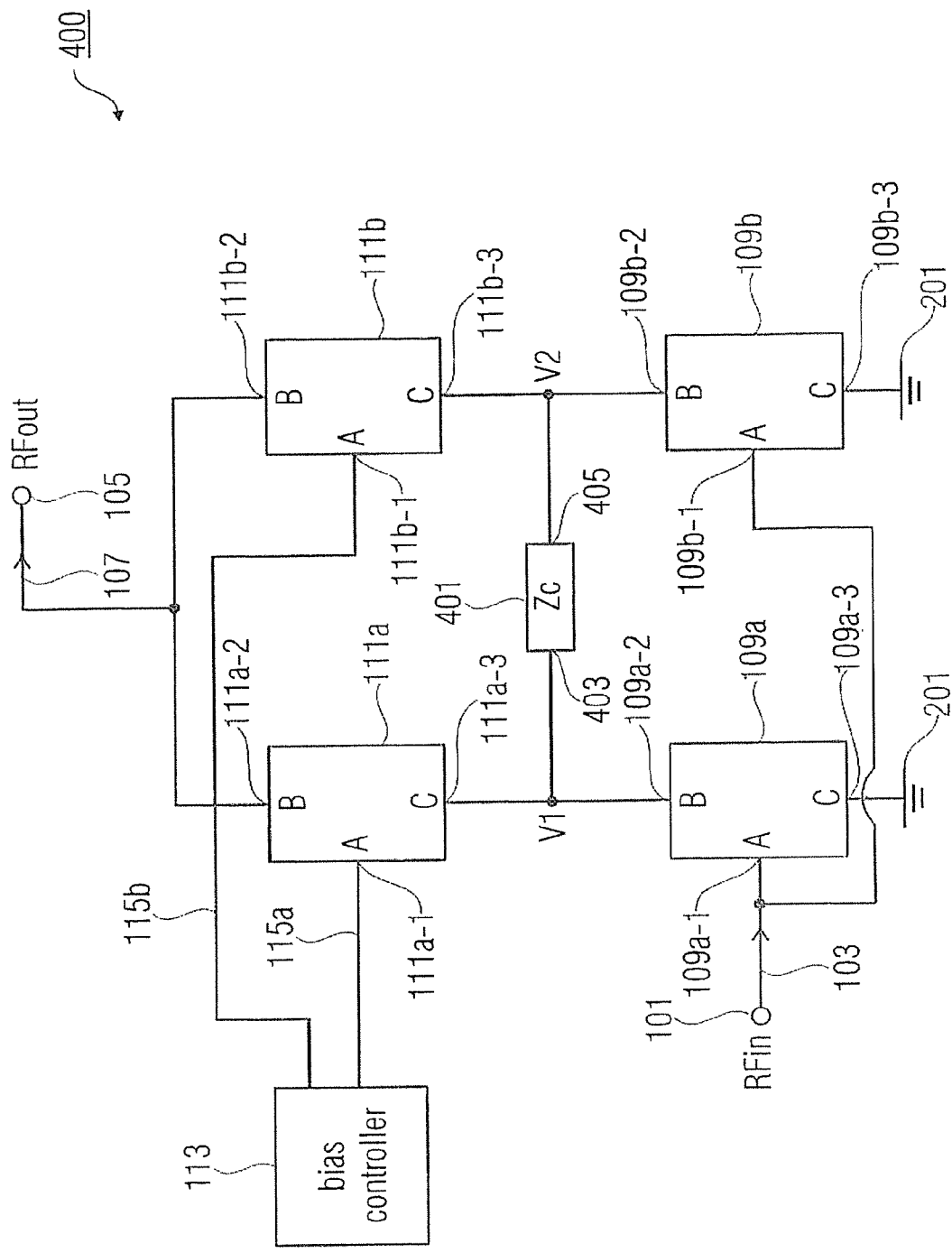
FIG. 4a shows a block schematic diagram of an amplifier according to a further embodiment of the present invention.

FIG. 4a shows a block schematic diagram of an amplifier 400 according to a further embodiment of the present invention. The amplifier 400 shown in FIG. 4a extends the amplifier 200 shown in FIG. 2 by the coupling impedance 401 which is coupled between the output terminal 109a-2 of the first lower active sub cell 109a and the output terminal 109b-2 of the second lower active sub cell 109b. Furthermore, in the example shown in FIG. 4a N=2. Nevertheless, an implementation comprising a plurality of lower active sub cells and upper active sub cells, wherein the output terminals of the lower active sub cells (and therefore also the input terminals of the upper active sub cells) are connected to a coupling impedance would also be possible.

By having the coupling impedance 401 between the lower active sub cells 109a, 109b and the upper active sub cells 111a, 111b linearity properties of the amplifier 400 can be further improved.

As the output terminals 109a-2, 109b-2 of the lower active sub cells 109a, 109b and the input terminals 111a-3, 111b-3 of the upper active sub cells 111a, 111b are not shorted, the first potential V1 can be adjusted by means of the biasing signal 115a at a first terminal 403 of the coupling impedance 401 and the second potential V2 can be adjusted by means of the second biasing signal 115b at a second terminal 405 of the coupling impedance 401. Hence, the potential V1 does not necessarily need to be fully independent from the potential V2, as the two nodes at which these potentials can be measured or derived can be coupled with each other by means of the coupling impedance 401.

Figure 4B:
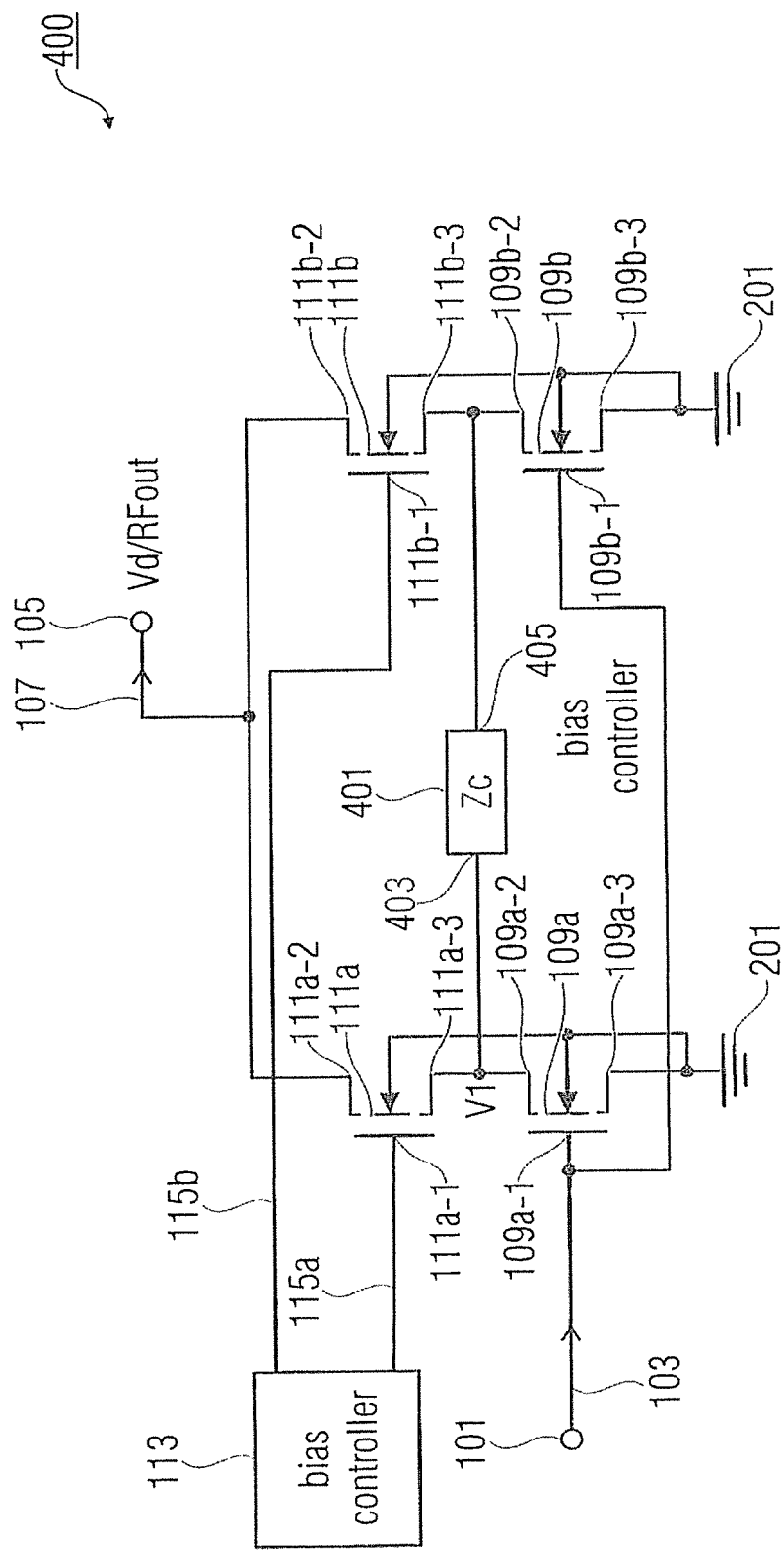

FIG. 4b shows a possible implementation of the amplifier 400 shown in FIG. 4a. The implementation of the amplifier 400 shown in FIG. 4b differs from the implementation of the amplifier 200 shown in FIG. 2b in the fact that the coupling impedance 401 is connected between the second terminal 109a-2, 109b-2 of the lower transistors 109a, 109b and in the fact that N=2.

Figure 5:
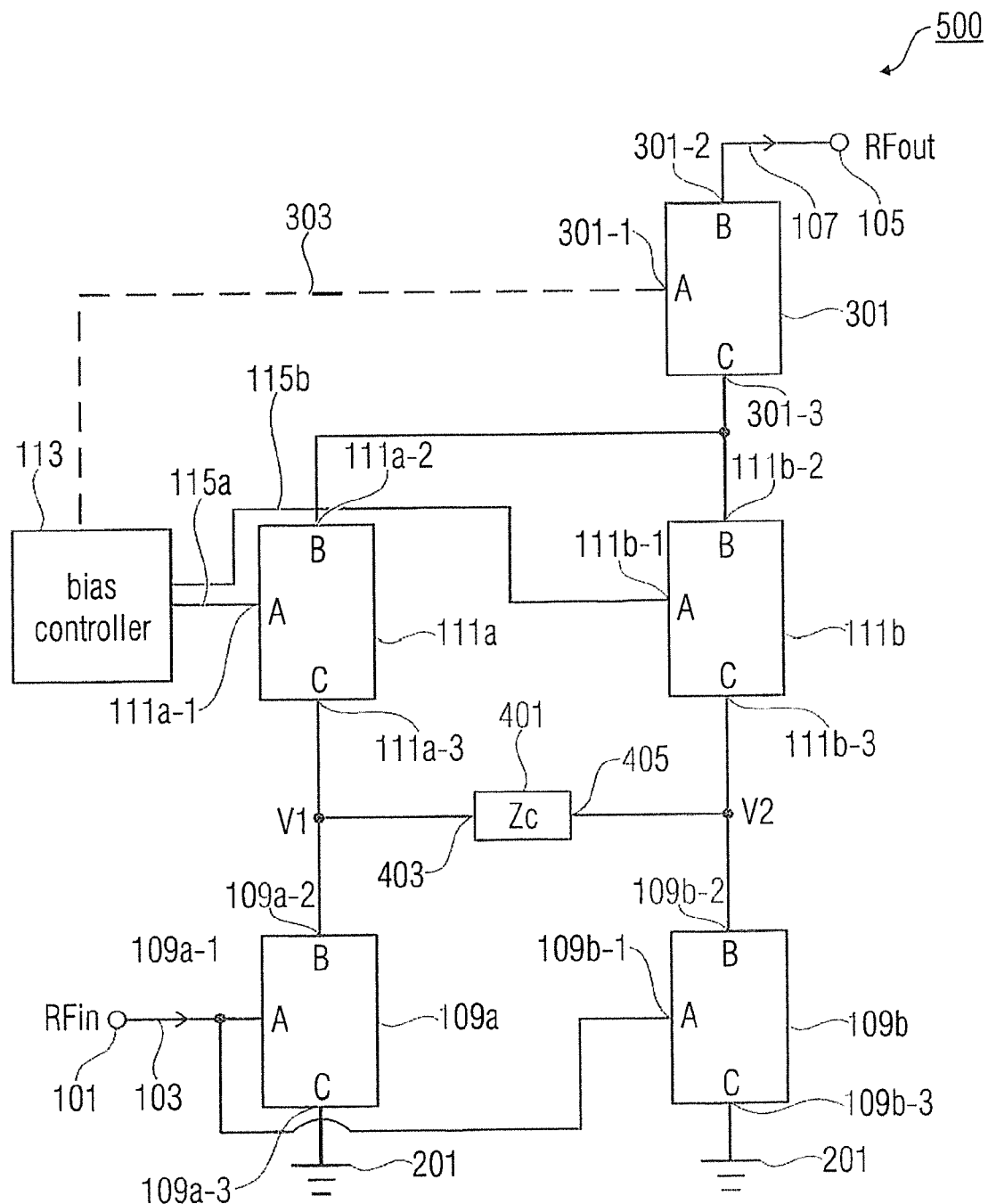
FIG. 5 shows a block schematic diagram of an amplifier according to a further embodiment of the present invention.

FIG. 5 shows a block schematic diagram of an amplifier 500 according to a further embodiment of the present invention.

The amplifier 500 shown in FIG. 5 extends the amplifier 300 shown in FIG. 3a by the coupling impedance 401 which is connected between the output terminals 109a-2, 109b-2 of the lower active sub cells 109a, 109b. Furthermore, in the example shown in FIG. 5 N=2. Nevertheless, as already mentioned an amplifier according to an embodiment of the present invention may also comprise a plurality of lower active sub cells and upper active sub cells wherein output terminals of the lower active sub cells (and input terminals of the upper active sub cells) are connected to a coupling impedance.

Different implementation variants of the sub cells provided in the amplifier 500 have already been shown in conjunction with FIGS. 3a to 3c.

Figure 6:
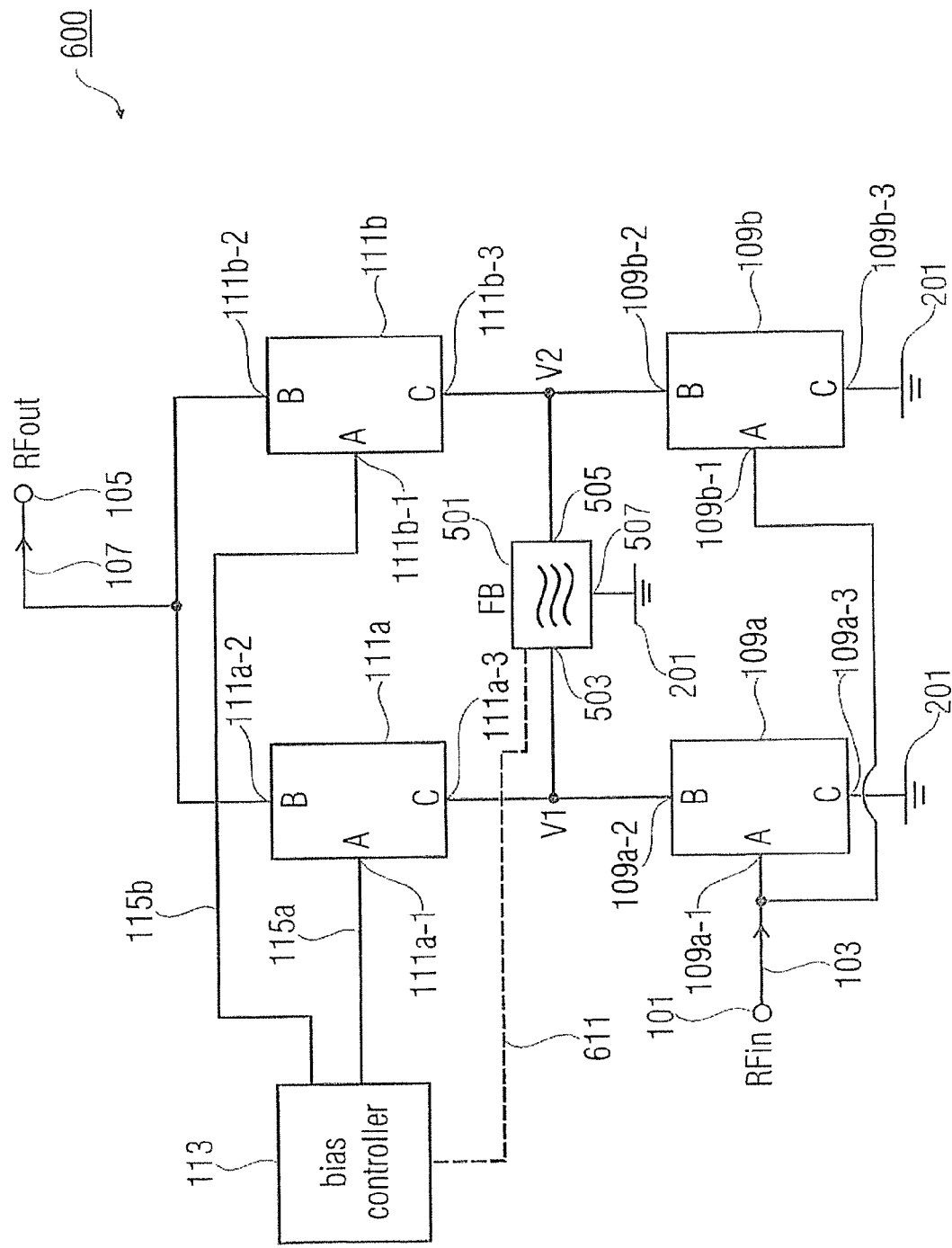
FIG. 6 shows a block schematic diagram of an amplifier according to a further embodiment of the present invention.

FIG. 6 shows an amplifier 600 according to a further embodiment of the present invention.

The amplifier 600 shown in FIG. 6 differs from the amplifier 400 shown in FIG. 4a in that instead of a coupling impedance 401 a coupling filter 501 is employed between the output terminal 109a-2 of the first lower active sub cells 109a and the output terminal 109b-2 of the second lower active sub cell 109b. In other words, a first terminal 503 of the coupling filter 501 is connected to the output terminal 109a-2 of the first lower active sub cell 109a and to the input terminal 111a-3 of the first upper active sub cell 111a. A second terminal 505 of the coupling filter 501 is connected to the output terminal 109b-2 of the second lower active sub cell 109b and to the input terminal 111b-3 of the second upper active sub cell 111b. Furthermore, a supply terminal 507 of the coupling filter 501 is connected to the ground potential terminal 201.

The coupling filter 501 may be an easy to implement passive filter but may be also a more complex (e.g. programmable) filter. As an example, the coupling filter 501 may have a complex frequency response. The implementation of the coupling filter 501 between the output terminals 109a-2, 109b-2 of the lower active sub cells 109a, 109b enables, especially when compared to a short circuit or no coupling at all between these output terminals 109a-2, 109b-2, an improved linearity of the amplifier 600. As an example, the coupling filter 501 may be chosen such that a cross modulation of the potentials V1, V2 reduces third order intermodulation products and therefore increases the linearity.

In the case of having a programmable coupling filter 501, the bias controller 113 may be configured to provide a filter control signal 611 to the coupling filter 501. The filter control signal 611 may be provided based on the output power of the output signal 107. As an example, the bias controller 113 may provide for different (desired) output powers of the output signal 107 not only different values for the biasing signals 115a, 115b, but also different values (e.g. settings of the coupling filter 501) for the filter control signal 611. Different values of the filter control signal 611 may result in different frequency responses of the coupling filter 501. Hence, for each (desired) output power of the output signal 107 an appropriate setting of the coupling filter 501 can be chosen which optimizes the linearity for the respective output power of the output signal 107.

Figure 7A:
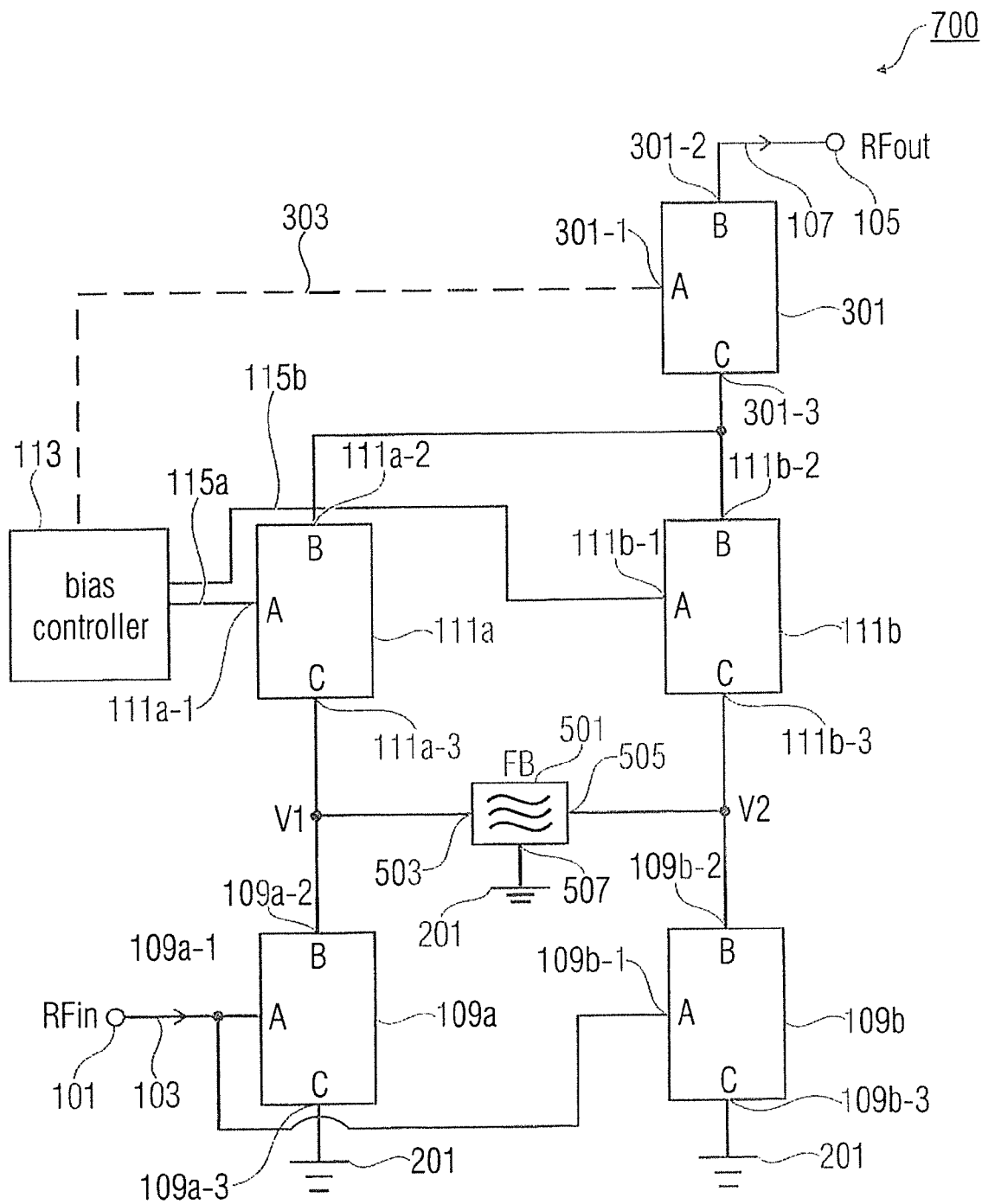
FIG. 7a shows a block schematic diagram of an amplifier according to a further embodiment of the present invention.

FIG. 7a shows a block schematic diagram of an amplifier 700 according to a further embodiment of the present invention. The amplifier 700 differs from the amplifier 500 shown in FIG. 5a in that the coupling impedance 401 is replaced by the coupling filter 501.

Figure 7B:
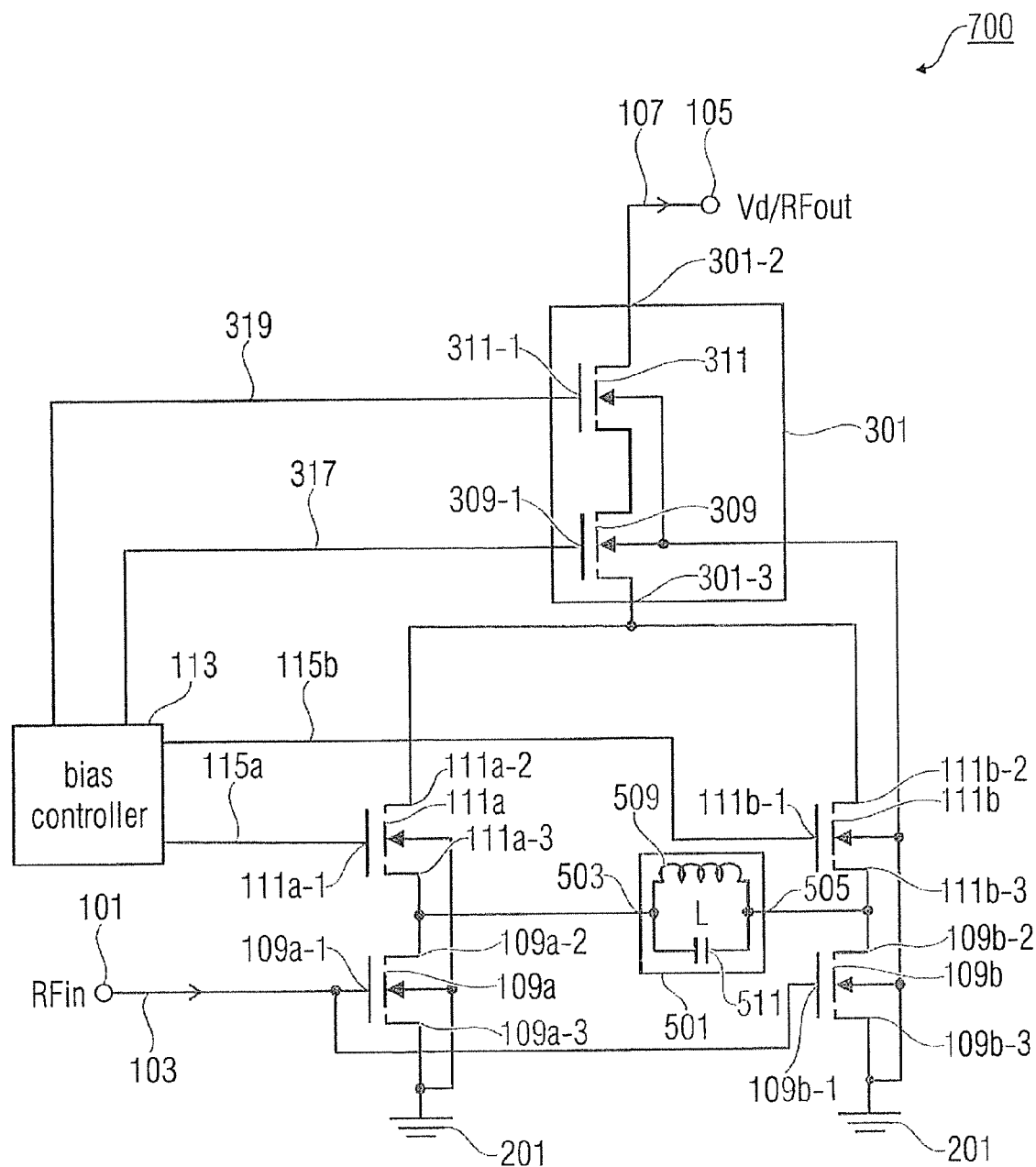

FIG. 7b shows a possible implementation of the amplifier 700 which is based on the stacked cascode concept of the amplifier 300 shown in FIG. 3. The amplifier 700 shown in FIG. 7b differs from the amplifier 300 shown in FIG. 3c in that the capacitances 313, 315 are omitted and in that it comprises the additional coupling filter 510. Furthermore N=2. According to a further embodiment, the amplifier 700 comprises the capacitances 313, 315.

Furthermore, in the amplifier 700 shown in FIG. 7b a possible implementation of the coupling filter 501 is shown. In this implementation the coupling filter 501 comprises an inductance (e.g. a coil) 509 and a filter capacitance 511. The inductance 509 and the filter capacitance 511 are connected in parallel between the second terminal 109a-2 of the first lower transistor 109a and the second terminal 109b-2 of the second lower transistor 109b.

The inductance 509 and the filter capacitance 511 may be chosen such that that a cross modulation of the potentials V1, V2 reduces third order intermodulation products and therefore increases the linearity.

Figure 8:
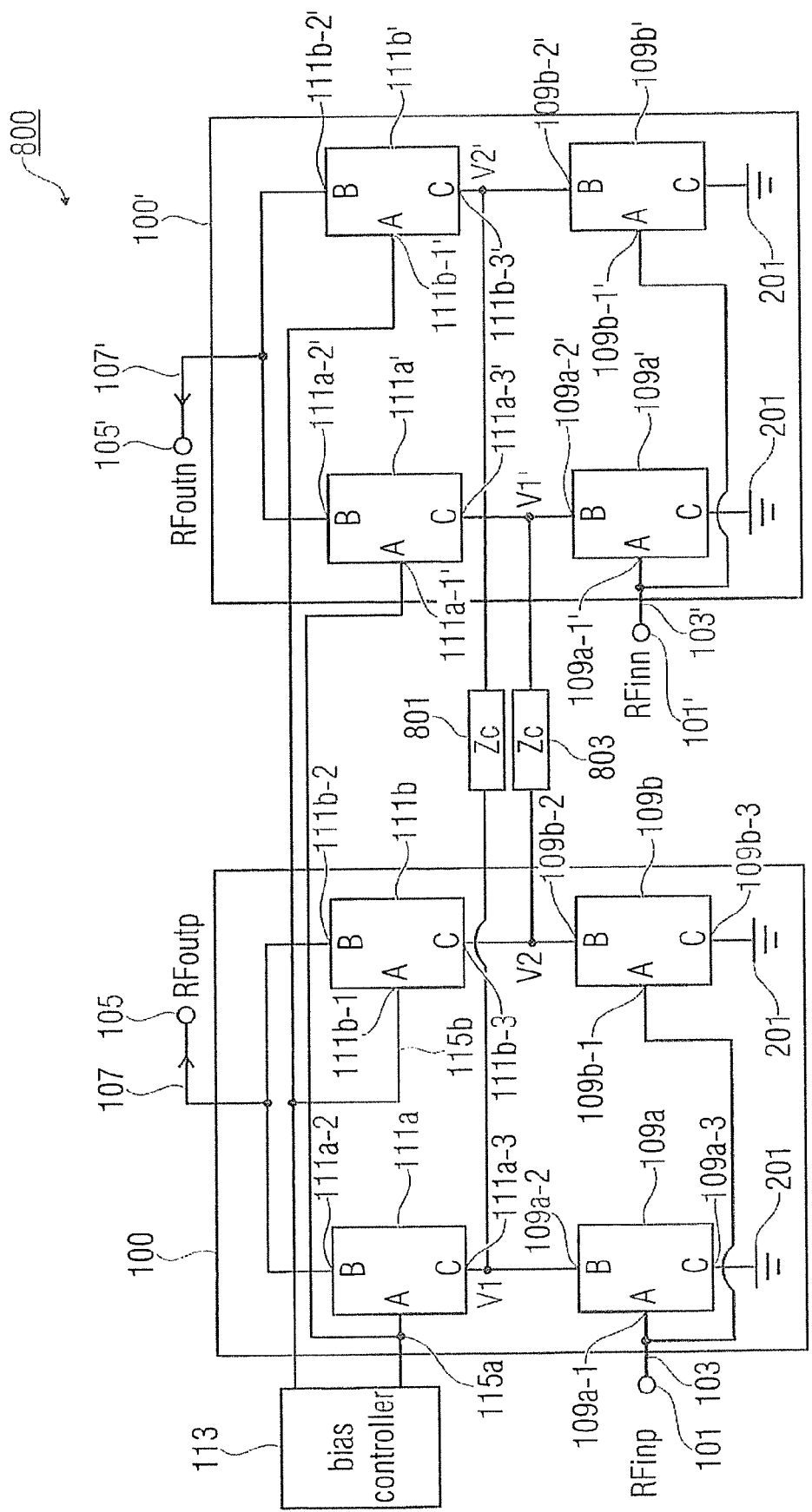
FIG. 8 shows a block schematic diagram of an amplifier according to a further embodiment of the present invention.

FIG. 8 shows a block schematic diagram of an amplifier 800 according to a further embodiment of the present invention. The amplifier 800 is configured to amplify differential input signals. In the example shown in FIG. 8 the amplifier 800 comprises two of the amplifiers 100 shown in FIG. 1. Hence, a first part amplifier 100 of the amplifier 800 is given the reference sign 100 and a second part amplifier 100' of the amplifier 800 is given the reference sign 100'.

As can be seen from FIG. 8, the two part amplifiers 100, 100' may be equal in the fact that the number of lower active sub cells and the number of upper active sub cells of the first part amplifier 100 and the second part amplifier 100' are equal, but the first part amplifier 100 and the second part amplifier 100' share one common bias controller 113. The second part amplifier 100' comprises a first lower active sub cell 109' and a second lower active sub cell 109b'. Furthermore, the second part amplifier 100' comprises a further amplifier input 101' for receiving a further input signal 103'. Furthermore, the second part amplifier 100' comprises a first upper active sub cell 111a' and a second upper active sub cell 111b'.

Input terminals 109a-1', 109b-1' of the lower active sub cells 109a', 109b' are connected to the further amplifier input 101' of the second part amplifier 100'. Furthermore, output terminals 109a-2', 109b-2' of the lower active sub cells 109a', 109b' of the second part amplifier 100' are not shorted. Furthermore, each of the upper active sub cells 111a', 111b' of the second part amplifier 100' comprises a biasing terminals 111a-1', 111b-1'. The bias controller 113 is configured to provide the first biasing signal 115a to the biasing terminal 111a-1 of the first upper active sub cell 111a of the first part amplifier 100 and to the biasing terminal 111a-1' of the first upper active sub cell 111a' of the second part amplifier 100'. Furthermore, the bias controller 113 is configured to provide the second biasing signal 115b to the biasing terminal 111b-1 of the second upper active sub cell 111b of the first part amplifier 100 and to the biasing terminal 111b-1' of the second upper active sub cell 111b' of the second part amplifier 100'. In other words, the first part amplifier 100 and the second part amplifier 100' receive the same biasing signals 115a, 115b from the bias controller 113. Furthermore, output terminals 111a-2', 111b-2' of the upper active sub cells 111a', 111b' of the second part amplifier 100' are connected to a further amplifier output 105' of the second part amplifier 100' at which a further output signal 100' is provided.

An input terminal 111a-3' of the first upper active sub cell 111a' of the second part amplifier 100' may be connected to the output terminal 109a-2' of the first lower active sub cell 109a of the second part amplifier 100'.' An input terminal 111b-3' of the second upper active sub cell 111b' of the second part amplifier 100' may be connected to the output terminal 109b-2' of the second lower active sub cell 109b' of the second part amplifier 100'.

Supply terminals 109a-3', 109b-3' of the lower active sub cells 109a', 109b' of the second part amplifier 100' may be connected to the ground potential terminal 201.

Furthermore, the amplifier 800 comprises a first coupling impedance 801 which is connected between the input terminal 111a-3 of the first upper active sub cell 111a of the first part amplifier 100 and the input terminal 111b-3' of the second upper active sub cell 111b' of the second part amplifier 100'. Furthermore, the amplifier 800 comprises a second coupling impedance 803 which is connected between the input terminal 111b-3 of the second upper active sub cell 111b of the first part amplifier 100 and the input terminal 111a-3' of the first upper active sub cell 111a' of the second part amplifier 100'.

According to further embodiments, the coupling impedances 801, 803 may be replaced by coupling filters (for example as shown in FIGS. 7a, 7b).

As none of the input terminals 111a-3, 111b-3, 111a-3', 111b-3' of the different upper active sub cells 111a, 111b, 111a', 111b' are shorted, potentials V1, V2, V1', V2' at this terminal may be different at the same point in time.

Hence, the linearity property of each path or stage (comprising a lower active sub cell and an upper active sub cell) can be adjusted in dependence on the output power of the output signals 107, 107'.

As already described, the amplifier 800 may be configured to amplify a differential input signal, such that the input signal 103 may be a first part signal of such differential input signal and the further input signal 103' may be another part signal of the differential input signal. Furthermore, the output signal 107 may be a first part signal of a differential output signal and the further output signal 107' may be a second part signal of such a differential output signal. The differential output signal may be an amplified version of the differential input signal.

To summarize, the amplifier 800 is configured to amplify a differential input signal comprising the input signal 101 and the further input signal 101'. The amplifier 800 comprises at least the four lower active sub cells 109a, 109b, 109a', 109b', the input 101, the further input 101', the four upper active sub cells 111a, 111b, 111a', 111b' and the bias controller 113. The bias controller 113 may be configured to provide the first biasing signal 115a to the first upper active sub cell 111a of the first part amplifier 100 and to the first upper active sub cell 111a' of the second part amplifier 100'. Furthermore, the bias controller 113 may be configured to provide the second biasing signal 115b to the second upper active sub cell 111b of the first part amplifier 100 and to the second upper active sub cell 111b' of the second part amplifier 100'. According to further embodiments of the present invention the bias controller 113 may be configured to provide a third biasing signal to the first upper active sub cell 111a' of the second part amplifier 100' and a fourth biasing signal to the second upper active sub cell 111b' of the second part amplifier 100'. The four biasing signals may be provided independent of each other, e.g., such that at least for some bias sets the four biasing signals are different to each other.

Figure 9A:
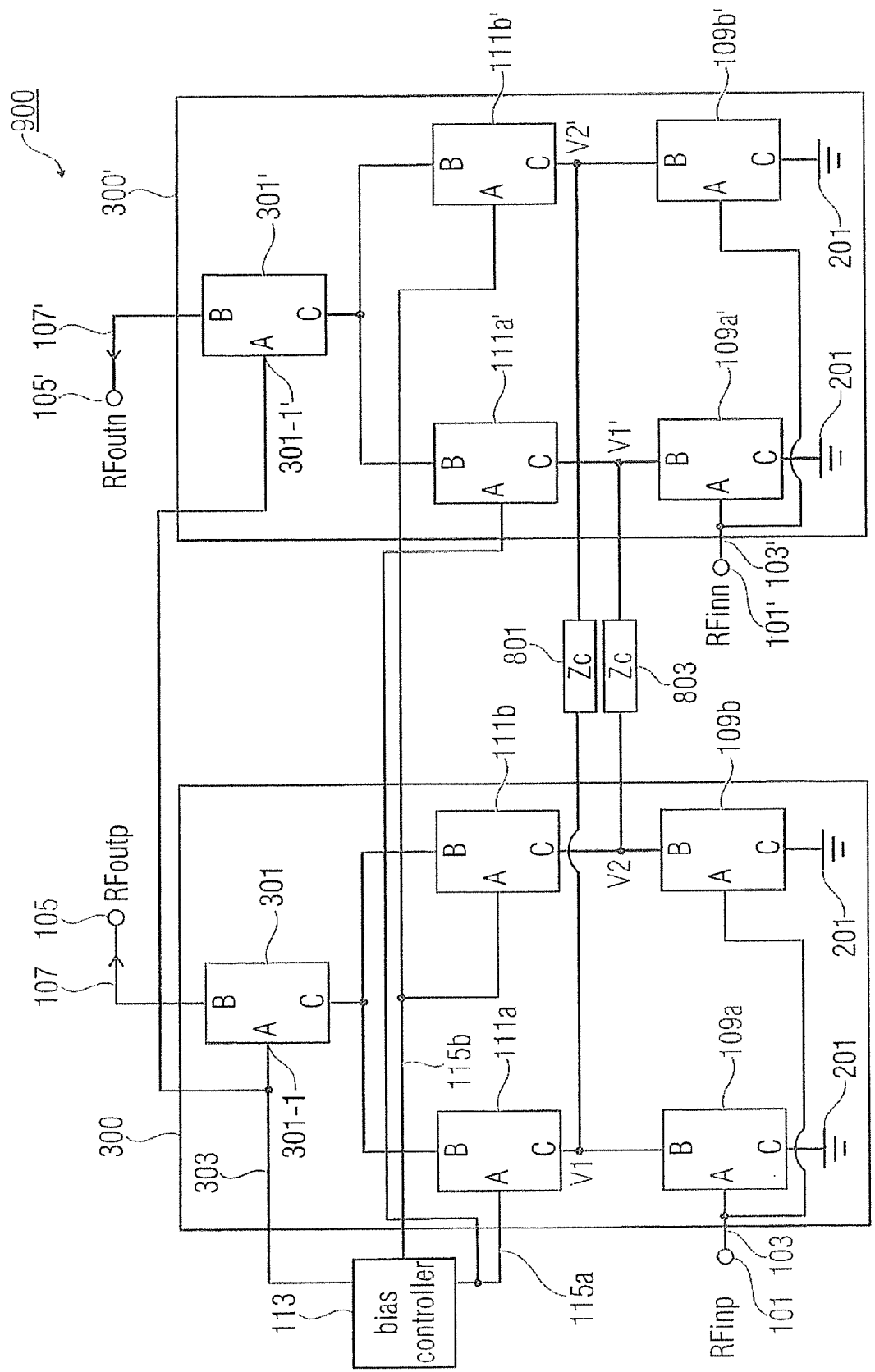
FIG. 9a shows a block schematic diagram of an amplifier according to a further embodiment of the present invention.

FIG. 9a shows a block schematic diagram of an amplifier 900 according to a further embodiment of the present invention.

The amplifier 900 differs from the amplifier 800 shown in FIG. 8 in that it comprises a first part amplifier 300 and a second part amplifier 300' wherein each is constructed as shown in FIG. 3a, wherein N=2. Hence, when comparing the amplifier 900 to the amplifier 800 each of the part amplifiers 300, 300' comprises a further active sub cell 301, 301' which is connected between the output terminals 111a-2, 111b-2, 111a-2', 111b-2' of the upper active sub cells 111a, 111b, 111a', 111b' and the amplifier outputs 105, 105'.

Furthermore, the bias controller 113 is configured to provide a further biasing signal 303 to biasing terminals 301-1, 301-1' of the further active sub cells 301, 301'. According to further embodiments of the present invention, the bias controller 113 may provide a first additional bias signal to the biasing terminal 301-1 of the further active sub cell 301 of the first part amplifier 300 and a second additional biasing signal to the biasing terminal 301-1' of the further active sub cells 301' of the second part amplifier 300', which is different from the first additional biasing signal.

Figure 9B:
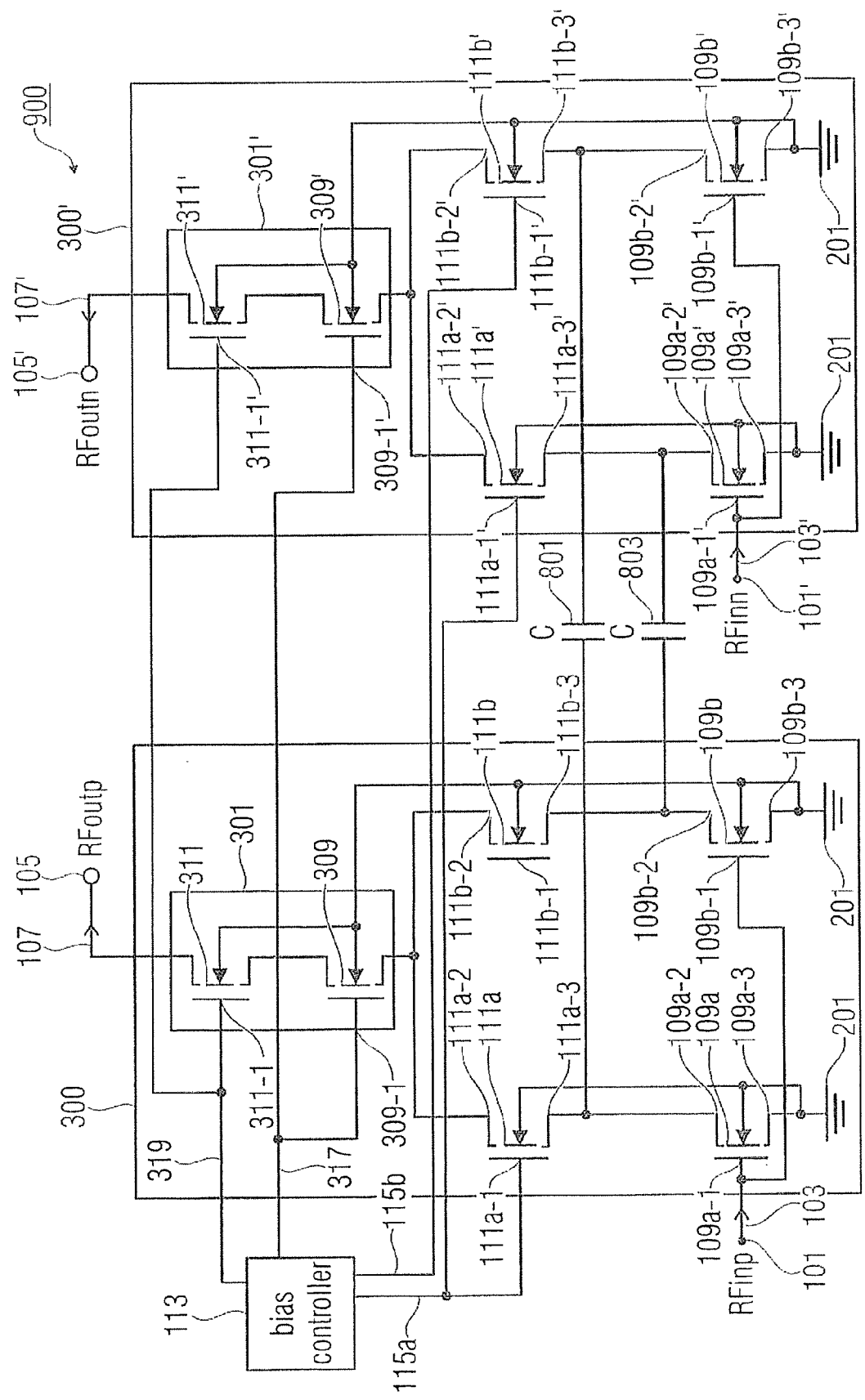

FIG. 9b shows a possible implementation of the amplifier 900 shown in FIG. 9a which is based on the stacked cascode concept as described in conjunction with FIGS. 3c and 7b. Each of the further active sub cells 301, 301' is implemented like the further active sub cell 301 shown in FIG. 7b (comprising a lower cascode transistor 309, 309' and an upper cascode transistor 311, 311').

Furthermore, in the example shown in FIG. 9b the first coupling impedance 801 and the second coupling impedance 803 are implemented as capacitances 801, 803.

The bias controller 113 is configured to provide the first additional biasing signal 317 to the control terminal 309-1 of the first additional (lower cascode) transistor 309 of the further active sub cell 301 of the first part amplifier 300 and to the control terminal 309-1' of the first additional (lower cascode) transistor 309' of the further active sub cell 301' of the second part amplifier 300'. Furthermore, the bias controller 113 is configured to provide the second additional biasing signal 319 to the control terminal 311-1 of the second additional (upper cascode) transistor 311 of the further active sub cell 301 of the first part amplifier 300 and to the control terminal 311-1' of the second additional (upper cascode) transistor 311' of the further active sub cell 301' of the second part amplifier 300'.

Nevertheless, according to further embodiments of the present invention, the bias controller 113 may be configured to provide to each of the transistors 309, 309', 311, 311' a dedicated biasing signal in dependence on the output power of the output signal 107, 107'.

In the following some aspects of embodiments of the present invention shall be summarized.

Embodiments provide a novel device-level linearization method for power amplifiers. The linearization is achieved by a circuit that allows adjusting the bias for optimum linearity response. Furthermore, embodiments do not suffer from complexity expenses which are associated with other conventional solutions. Moreover, the embodiments are suitable for terminal equipment as they do not consume extra chip area than that required for the core amplifying device. They also address the problem of linearizing power amplifiers operating in deep class-AB where transconductance manipulation is of little use and diode-connected devices have low impact and improvement.

Embodiments have the following advantageous properties:
  Embodiments have the ability of being programmable according to the mean input power through controlled biasing. Real time adaptation to changing operating conditions such as of output power, temperature and load impedance for overall best performance is feasible.
  The programmability of embodiments provides agility in dealing with varying operating conditions for the PA such as temperature and load impedance.

The analog linearization method improves all of the linearity figures of merit of the power amplifier (AM-AM response/AM-PM response/IM3/ACPR) so that the linearity specifications of the communications standard can be met with less back-off. Thus, higher efficiency can be utilized from the power amplifier.

As embodiments place some of the divided cascodes closer to a class B operation than the main cascode (Class-AB), higher efficiencies could be reached for the same output power than a conventional cascode.

Embodiments do not suffer from the huge area requirements incurred by the required decoupling capacitors in conventional analog predistortion solutions which utilize bias manipulations for high linearity. These capacitors are simply not needed in embodiments. This reflects in smaller die size and consequently lower financial cost.

Embodiments overcome the complexity issues incurred by the digital predistortion techniques as it resorts to simpler bias manipulation methods to control the linearity behavior of the PA.

Embodiments do not suffer from the drawbacks of limited bandwidth associated with feedback systems or reduced efficiency associated with feedforward solutions.

Embodiments allow considerable improvement of both amplitude and phase nonlinearity resulting in high linear output power at low power back-off.

Embodiments are also compatible with conventional CMOS power amplifier architectures designed for high power and ruggedness such as the stacked-cascode architectures.

Figure 11:
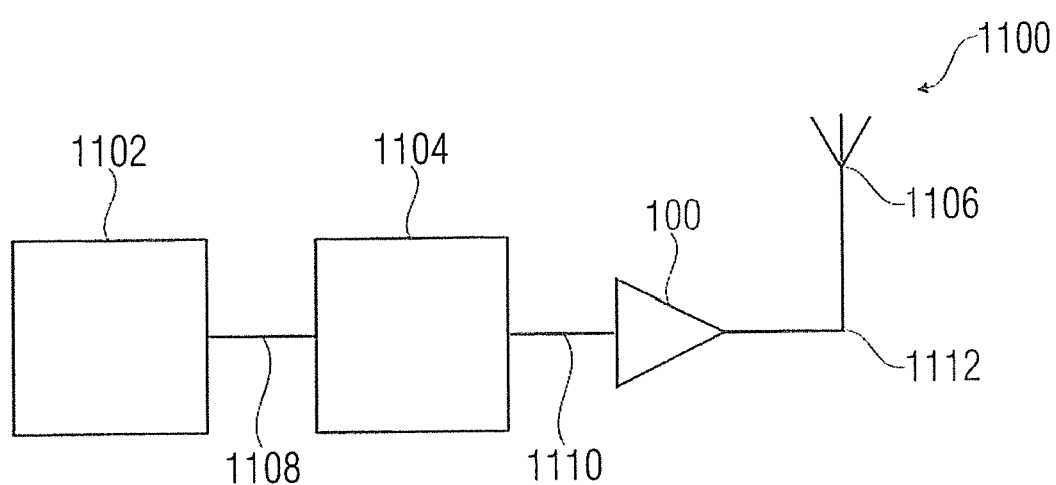
FIG. 11 shows a block schematic diagram of a mobile communication device according to an embodiment of the present invention.

FIG. 11 shows a mobile communication device 1100 according to a further embodiment of the present invention.

The mobile communication device 1100 comprises a baseband processor 1102, an RF modulator 1104 and an amplifier 100 according to an embodiment of the present invention. Furthermore, the mobile communication device 1100 comprises an antenna 1106. The (digital) baseband processor 1102 is configured to provide a baseband signal 1108 to the RF modulator 1104. The RF modulator 1104 is configured to provide, based on the baseband signal 1108, an input signal 1110 to the amplifier 100. The input signal may be, for example, the input signal 103 (in the single ended case) or a differential input signal (comprising the input signal 103 and the further input signal 103'). The amplifier 100 is configured to provide, based on the input signal 1110, an output signal 1112 to the antenna 1106, the output signal 1112 may be, for example the output signal 107 (in the single ended case) or a differential output signal (comprising the output signal 107 and the further output signal 107').

The antenna 1106 is configured to relay the output signal 1112.

Although in the example shown in FIG. 11 the mobile communication device 1100 comprises the amplifier 100, it may also comprise any other amplifier according to an embodiment of the present invention.

According to some embodiments of the present invention the mobile communication device 1100 may be a portable mobile communication device.

The mobile communication device 1100 may be configured to perform a voice and/or data communication (e.g. according to a mobile communication standard) with another (portable) mobile communication device and/or a mobile communication base station.

Such a (portable) mobile communication device may be, for example, a mobile handset as, for example, a mobile phone (cell phone), a so called smart phone or a tablet PC, a broadband modem, a notebook or a laptop, but also a router or a personal computer.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. An amplifier comprising:
an amplifier input for receiving an input signal;
an amplifier output for providing an output signal;
a first lower active sub cell and a second lower active sub cell, each comprising an input terminal and an output terminal, wherein the input terminals of the lower active sub cells are connected to the amplifier input and the output terminals of the lower active sub cells are not shorted;
a first upper active sub cell and a second upper active sub cell, each comprising a biasing terminal, an input terminal and an output terminal, wherein the input terminals and the output terminals of the upper active sub cells are coupled between the output terminals of the lower active sub cells and the amplifier output;
a bias controller configured to provide a first biasing signal to the biasing terminal of the first upper active sub cell and a second biasing signal to the biasing terminal of the second upper active sub cell in dependence on an output power of the output signal; and
a coupling impedance which is connected between the output terminals of the lower active sub cells.

2. The amplifier according to claim 1, wherein the upper active sub cells are configured such that a potential at their input terminals is dependent on a potential at their biasing terminals.

3. The amplifier according to claim 1, wherein the bias controller is configured to adjust a potential at the input terminal of the first upper active sub cell by means of the first biasing signal and to adjust a potential at the input terminal of the second upper active sub cell by means of the second biasing signal.

4. The amplifier according to claim 1, wherein the bias controller comprises a plurality of different bias sets, each bias set comprising a potential value for the first biasing signal and a potential value for the second biasing signal, wherein the bias controller is configured to choose for a given output power of the output signal the bias set out of the plurality of bias sets having the highest linearity for the given output power out of the plurality of bias sets.

5. The amplifier according to claim 1,
wherein the input terminal of the first upper active sub cell is connected to the output terminal of the first lower active sub cell; and
wherein the input terminal of the second upper active sub cell is connected to the output terminal of the second lower active sub cell.

6. The amplifier according to claim 1, wherein the output terminal of the first upper active sub cell is connected to the output terminal of the second upper active sub cell.

7. The amplifier according to claim 6, further comprising a further active sub cell comprising an input terminal and an output terminal, wherein the input terminal of the further active sub cell is connected to the output terminals of the upper active sub cells and wherein the output terminal of the further active sub cell is connected to the amplifier output.

8. The amplifier according to claim 7, wherein the further sub cell comprises a biasing terminal and wherein the bias controller is configured to provide a further biasing signal to the biasing terminal of the further active sub cell in dependence of the output power of the output signal.

9. The amplifier according to claim 7, wherein the further active sub cell comprises a transistor, a control terminal of which is connected to a shunt capacitance, and a switchable path of which is coupled between the input terminal and the output terminal of the further active sub cell.

10. The amplifier according to claim 7,
wherein the further active sub cell comprises a cascode comprising a lower transistor and an upper transistor, wherein switchable paths of the lower transistor and the upper transistor are coupled between the input terminal and the output terminal of the further sub cell; and
wherein the bias controller is configured to provide a first additional biasing signal to a control terminal of the lower transistor and a second additional biasing signal to a control terminal of the upper transistor in dependence on the output power of the output signal.

11. The amplifier according to claim 1,
wherein the first upper active sub cell comprises a first transistor, a control terminal of which is connected to the biasing terminal of the first upper active sub cell and a switchable path of which is coupled between the input terminal and the output terminal of the first upper active sub cell; and
wherein the second upper active sub cell comprises a first transistor, a control terminal of which is connected to the biasing terminal of the second upper active sub cell and a switchable path of which is coupled between the input terminal and the output terminal of the second upper active sub cell.

12. The amplifier according to claim 11, where a gate width of the first transistor of the first upper active sub cell is different from a gate width of the first transistor of the second upper active sub cell.

13. The amplifier according to claim 1,
wherein the first lower active sub cell comprises a first transistor, a control terminal of which is connected to the amplifier input and a switchable path of which is coupled between a reference potential terminal of the amplifier and the output terminal of the first lower active sub cell; and
wherein the second lower active sub cell comprises a second transistor, a control terminal of which is connected to the amplifier input and a switchable path of which is coupled between the reference potential terminal and the output terminal of the second lower active sub cell.

14. The amplifier according to claim 1, wherein transistors of the active sub cells are from the same type of transistors out of NPN, PNP, P-MOS, N-MOS.

15. The amplifier according to claim 1, wherein the first lower active sub cell and the first upper active sub cell are chosen to amplify the input signal, while the second lower active sub cell and the second upper active sub cell are chosen for adjusting a linearity of the amplifier by means of the second biasing signal in dependence on the output power of the output signal.

16. The amplifier according to claim 1,
wherein the amplifier is configured to amplify a differential input signal comprising the input signal and a further input signal and to provide a differential output signal comprising the output signal and a further output signal;
wherein the amplifier further comprises:
a further input for receiving the further input signal and a further output for providing the further output signal;
a third lower active sub cell and a fourth lower active sub cell, each comprising an input terminal and an output terminal, wherein the input terminals of the third lower active sub cell and the fourth lower active sub cell are connected to the further amplifier input and the output terminals of the third lower active sub cell and the fourth lower active sub cell are not shorted; and
a third upper active sub cell and a fourth upper active sub cell, each comprising a biasing terminal, an input terminal and an output terminal, wherein the input terminals and the output terminals of the third upper active sub cell and the fourth upper active sub cell are coupled between the output terminals of the third lower active sub cell and the fourth lower active sub cell and the further amplifier output; and
wherein the bias controller is configured to provide a third biasing signal to the biasing terminal of the third upper active sub cell and a fourth biasing signal to the biasing terminal of the fourth upper active sub cell in dependence on the output power of the output signal.

17. The amplifier according to claim 16,
further comprising a first coupling impedance or coupling filter which is connected between the input terminal of the first upper active sub cell and the input terminal of the fourth upper active sub cell; and
a second coupling impedance or coupling filter which is connected between the input terminal of the second upper active sub cell and the input terminal of the third upper active sub cell.

18. The amplifier according to claim 16, wherein the bias controller is configured to provide the first biasing signal and the third biasing signal such that they are for every output power of the output signal equal and to provide the second and the fourth biasing signal such that they are for every output power of the output signal equal.

19. An amplifier comprising:
an amplifier input for receiving an input signal;
an amplifier output for providing an output signal;
a first lower active sub cell and a second lower active sub cell, each comprising an input terminal and an output terminal, wherein the input terminals of the lower active sub cells are connected to the amplifier input and the output terminals of the lower active sub cells are not shorted;
a first upper active sub cell and a second upper active sub cell, each comprising a biasing terminal, an input terminal and an output terminal, wherein the input terminals and the output terminals of the upper active sub cells are coupled between the output terminals of the lower active sub cells and the amplifier output; and a bias controller configured to provide a first biasing signal to the biasing terminal of the first upper active sub cell and a second biasing signal to the biasing terminal of the second upper active sub cell in dependence on an output power of the output signal wherein the input terminals and the output terminals of the upper active sub cells are directly connected between the output terminals of the lower active sub cells and the amplifier output; and wherein a potential value for the first biasing signal is different from a potential value for the second biasing signal.

20. An amplifier comprising:

an amplifier input for receiving an input signal;

an amplifier output for providing an output signal;

a first lower active sub cell and a second lower active sub cell, each comprising an input terminal and an output terminal, wherein the input terminals of the lower active sub cells are connected to the amplifier input and the output terminals of the lower active sub cells are not shorted;

a first upper active sub cell and a second upper active sub cell, each comprising a biasing terminal, an input terminal and an output terminal, wherein the input terminals and the output terminals of the upper active sub cells are coupled between the output terminals of the lower active sub cells and the amplifier output; and a bias controller configured to provide a first biasing signal to the biasing terminal of the first upper active sub cell and a second biasing signal to the biasing terminal of the second upper active sub cell in dependence on an output power of the output signal a coupling filter which is connected between the output terminals of the lower active sub cells.

21. The amplifier according to claim 20, wherein the coupling filter is chosen such that that a cross modulation between the output terminals of the lower active sub cells reduces third order intermodulation products when compared to a case in which the output terminals of the lower active sub cells are shorted.

22. An amplifier comprising:

an amplifier input for receiving an input signal;

an amplifier output for providing an output signal;

a first lower transistor and a second lower transistor, each comprising a control terminal, a first terminal and a second terminal, wherein the control terminals of the lower transistors are connected to the amplifier input, the second terminals of the lower transistors are not shorted and the first terminals of the lower transistor are coupled to a reference potential terminal of the amplifier;

a first upper transistor and a second upper transistor, each comprising a control terminal, a first terminal and a second terminal, wherein the first terminal of the first upper transistor is connected to the second terminal of the first lower transistor, the first terminal of the second upper transistor is connected to the second terminal of the second lower transistor and the second terminals of the upper transistors are shorted;

a cascode comprising a lower cascode transistor and an upper cascode transistor, wherein a first terminal of the lower cascode transistor is connected to the second terminals of the upper transistors and a second terminal of the upper cascode transistor is connected to the amplifier output; and a bias controller configured to provide a first biasing signal to the biasing terminal of the first upper active sub cell, a second biasing signal to the biasing terminal of the second upper active sub cell, a third biasing signal to a control terminal of the lower cascode transistor and a fourth biasing signal to a control terminal of the upper cascode transistor in dependence on an output power of the output signal.

23. A mobile communication device comprising:

a baseband processor configured to provide a baseband signal;

an RF modulator configured to provide, based on the baseband signal an input signal;

an amplifier comprising:

an amplifier input for receiving the input signal;

an amplifier output for providing an output signal;

a first lower active sub cell and a second lower active sub cell, each comprising an input terminal and an output terminal, wherein the input terminals of the lower active sub cells are connected to the amplifier input and the output terminals of the lower active sub cells are not shorted;

a coupling impedance connected between the output terminals of the lower active sub cells;

a first upper active sub cell and a second upper active sub cell, each comprising a biasing terminal, an input terminal and an output terminal, wherein the input terminals and the output terminals of the upper active sub cells are coupled between the output terminals of the lower active sub cells and the amplifier output;

a bias controller configured to provide a first biasing signal to the biasing terminal of the first upper active sub cell and a second biasing signal to the biasing terminal of the second upper active sub cell in dependence on an output power of the output signal;

wherein the input terminals and the output terminals of the upper active sub cells are directly connected between the output terminals of the lower active sub cells and the amplifier output and wherein a potential value for the first biasing signal is different from a potential value for the second biasing signal; and an antenna configured to receive the output signal and to relay the output signal.

* * * * *